(12) United States Patent  
Flynn et al.

(10) Patent No.: US 6,319,369 B1  
(45) Date of Patent: Nov. 20, 2001

(54) IGNITION MEANS FOR A CATHODIC ARC SOURCE

(75) Inventors: David Ian Flynn, Tunbridge Wells (GB); Xu Shi, Singapore (SG); Hong Siang Tan, Selangor (MY); Beng Kang Tay, Singapore (SG)

(73) Assignee: Filplas Vacuum Technology PTE, Ltd., Singapore (SG)

( * ) Notice: Subject to any disclaimer, the term of this patent is extended or adjusted under 35 U.S.C. 154(b) by 0 days.

(21) Appl. No.: 09/435,096

(22) Filed: Nov. 5, 1999

Related U.S. Application Data

(62) Division of application No. 08/894,420, filed on Nov. 21, 1997, now Pat. No. 6,031,239.

(30) Foreign Application Priority Data

Feb. 20, 1995 (GB) .................................................. 9503305

(51) Int. Cl.[7] .................................................. C23C 14/32
(52) U.S. Cl. .............................. 204/192.38; 204/298.41; 427/580
(58) Field of Search .................. 204/192.38, 298.41; 427/580

(56) References Cited

U.S. PATENT DOCUMENTS

| | | | |
|---|---|---|---|
| 3,916,034 | 10/1975 | Tsuchimoto | 427/571 |
| 4,434,038 | 2/1984 | Morrison, Jr. | 204/192.15 |
| 4,551,810 | 11/1985 | Levin | 364/475 |
| 4,588,955 | 5/1986 | Anderson | 250/423 R |
| 4,804,879 | 2/1989 | Fukumoto | 250/396 ML |
| 4,845,371 | 7/1989 | Stieber | 250/396 R |
| 5,198,674 | 3/1993 | Underwood | 250/396 ML |
| 5,279,723 | 1/1994 | Falabella et al. | 204/298.41 |
| 5,441,624 | 8/1995 | Chan et al. | 204/298.41 |
| 5,554,853 | 9/1996 | Rose | 250/492.21 |
| 5,554,857 | 9/1996 | Benveniste | 250/492.21 |
| 5,580,429 | 12/1996 | Chan et al. | 204/192.38 |
| 5,838,522 | 11/1998 | Komvopoulos et al. | 360/122 |
| 5,840,163 | 11/1998 | Welty | 204/192.38 |
| 5,851,475 | 12/1998 | Komvopoulos et al. | 264/430 |
| 5,858,477 | 1/1999 | Veerasamy et al. | 427/562 |

FOREIGN PATENT DOCUMENTS

| | | |
|---|---|---|
| 0 277 341 A2 | 8/1988 | (EP) . |
| 0 282 677 A1 | 9/1988 | (EP) . |
| 0 486 147 A2 | 5/1992 | (EP) . |
| 2 117 610 A | 10/1983 | (GB) . |
| WO 87/02072 | 4/1987 | (WO) . |
| WO 92/16959 | 10/1992 | (WO) . |

OTHER PUBLICATIONS

WO,A,92 16959 (Commw Scient Ind Res Org; Sutton Tools Pty LTD(AU) Oct. 1, 1992 cited in the application, see p. 4, last line—p. 6, claims 1–7.

Molecular Crystals and Liquid Crystals, Letters, Series 2, vol. 7, No. 2, Mar. 1, 1990, pp. 2339–2345, D. M. Sanders, Review of Ion–Based Coating Processes Derived From the Cathodic Arc, pp. 2341.

Diamond and Related Materials, vol. 2, No. 10, Aug. 16, 1993, pp. 1350–1354, M. Kuhn, et al., Deposition of Carbon Films by a Fultered Cathodic Arc, p. 1352.

Deposition of carbon films by a filtered cathodic arc, 6178 Diamond and Related Materials, 2(19930 Aug. 16, No. 10, Lausanne, CH, pp. 1350–1354, M. Kuhn, et al.

*Primary Examiner*—Rodney G. McDonald  
(74) *Attorney, Agent, or Firm*—Kirschstein, et al.

(57) ABSTRACT

A coating of positive ions is applied to a substrate by generating an arc at a cathode, directing a beam of ions emitted from the cathode to the substrate via a filter path to remove macroparticles, igniting the arc by moving an arc ignition from a retracted position to an ignition position in which cathode contact is made, and storing the position in which arc ignition occurred.

9 Claims, 17 Drawing Sheets

FIG.10. Double Bend (in and out pieces at 45°) neutrals' wall-hittings vs torus angles

IGNITION MEANS FOR A CATHODIC ARC SOURCE

CROSS REFERENCE TO RELATED APPLICATION

This application is a division of U.S. patent application Ser. No. 08/894,420, filed Nov. 21, 1997, now U.S. Pat. No. 6,031,239.

BACKGROUND OF THE INVENTION

This invention relates to a filtered cathodic arc source. More specifically, this invention relates to an improved filtered cathodic arc for generating a plasma beam containing positive ions for depositing a coating of the positive ions on a substrate. The invention relates to improved filtering of the plasma beam, to a method and apparatus for coating substrates using a filtered cathodic arc, to a method and apparatus for generating multi-layer coatings using a filtered cathodic arc, to ignition of the filtered cathodic arc, and to substrates having a coating of positive ions obtained using a filtered cathodic arc.

Various methods and apparatus are known in the art for obtaining a thin film or thin coating on a substrate. It is known to deposit films by physical vapour deposition techniques and chemical vapour deposition techniques; this invention relates to physical techniques. It is known to provide such coatings using magnetron sputtering, and one such method is described in U.S. Pat. No. 5,225,057. The quality of these films is open to considerable improvement. Sputtering is sometimes ion beam assisted. The purpose of the ion beam may be to clean substrate prior to coating or to promote reaction of subsequent deposited layers.

Another method of depositing thin films involves the use of positive ions generated from a cathodic arc source. The cathodic arc is a form of electrical discharge in vacuum which is sustained in metal plasma created by the arc alone and does not require the addition of an inert gas. Currents used in cathodic arc systems are typically of the order of 100 amps, at around 30 volts. A large percentage of the metal vapour generated by the arc is ionised by the discharge and a fraction of the arc current escapes as a beam of positive ions; this fraction is steered and optionally filtered to produce a coating on a distal substrate. The increased energy of these positive ions compared to the particles in previous deposition methods is thought to be a reason why arc evaporation techniques would deposit high density, high uniformity films. Deposition of thin films by filtered arc evaporation is described generally by P. J. Martin in Surface and Coatings Technology, Volumes 54/55 (1992) pages 136–142, and further reviewed in Surface Engineering, Volume 9 (1993), no. 1, pages 51–57.

Cathodic vacuum arc systems have thus been recognized as potentially a cost-effective method to produce coatings in a vacuum. However, the approaches taken do not address the requirements needed for the industrial applications of this technique. Such industrial system must be automatic, easily maintained and produce a large coating area, free of blemishes.

It has been observed in the deposition of films using cathodic arc technology that the plasma beam of positive ions and electrons produced by the arc is frequently contaminated by large, typically neutral, particles that are multi-atom clusters. These contaminating particles are commonly referred to as macroparticles and can be defined as particles visible under the optical microscope in a film deposited using cathodic arc methods. The presence of macroparticles in deposited films has precluded the use of cathodic arc techniques for obtaining optical and electronic coatings.

Much work in the art has been directed towards filtering macroparticles from the plasma beam, thereby eliminating the undesirable side effects of the presence of macroparticles in the deposited coating. GB-A-2117610 uses a baffle placed directly between the cathode and the substrate to prevent macroparticles reaching the substrate. The positive ions in the plasma beam are focused around the baffle. This has the disadvantage that there is a very low transmission of the plasma beam to the substrate. Further, some macroparticles reach the substrate by bouncing off the sides of the apparatus.

U.S. Pat. No. 5,279,723, in the name of Falabella et al, describes a cathodic ion source in which the plasma beam is filtered in an attempt to eliminate macroparticles by providing a bent magnetic field to guide ions in the plasma beam around a 45° bend, there being no line-of-sight from the arc spot to the substrate. U.S. Pat. No. 5,279,723 also describes using permanently fixed baffles in the plasma duct to trap macroparticles. These confer the disadvantage that they quickly become covered with a dense coating of macroparticles which can fall back into the plasma beam and therefore lead to contamination of the substrate coating. Cleaning of these baffles is awkward as it must be carried out on a partially disassembled cathodic arc source. A similar shaped duct is described in U.S. Pat. No. 5,433,836.

Neither apparatus entirely prevents macroparticles from the plasma beam arriving at the substrate; it is indicated that tests of U.S. Pat. No. 5,279,723 show a figure of less than 0.2 macroparticles/cm$^2$/minute of coating time for this apparatus. This latter figure, however, is not accompanied by any precise deposition conditions thus preventing any confident assessment of the filtering efficiency of the apparatus described.

Other known apparatus use a 90° bend duct with an axial magnetic field to filter out the macroparticles. Although these may achieve acceptable results, they do not provide a long term solution for industrial equipment designed for near-continuous working. The generous amount of materials coated onto the duct wall build up over time and may lead to particles later being resputtered back into the plasma flux. Thus, only short periods of use of the equipment is possible. Also, deposited films still contain significant macroparticle contamination.

A third U.S. Pat. No. 5,401,543, describes using a particular cathode target material, but still suffers from high levels of macroparticles in deposited films.

The number of macroparticles in the plasma beam can be reduced by increasing the pressure in the vacuum chamber. However, an increase in pressure in the vacuum chamber is likely to lead to a deterioration in the properties of the layer deposited on the substrate. When depositing tetrahedral amorphous carbon, a trace amount of $H_2$ can reduce macroparticles and increase transparency in the visible light range but will compromise the density and hardness of the deposited layer, by gas inclusion in the deposited film.

It is therefore a problem in the art to generate a filtered plasma beam from a cathodic arc source, which filtered beam is substantially free of macroparticles.

Another related problem concerns a tool that is needed to ignite the arc. Once ignited, the tool is no longer required until arc re-ignition. Initiation of the arc has been typically determined visually, whereby a graphite rod fixed to a grounded stainless steel plunger is manually manoeuvred against the cathode and in which the movement is observed via an observation window in the wall of the vacuum chamber. This arrangement is particularly awkward, especially as the window is rapidly coated and becomes opaque. Alternatively, a fixed tungsten or graphite trigger mounted close to the cathode surface is used to ignite the arc by the application of a high voltage. Due to this proximity to the cathode, the elements of the igniter tend to contaminate the plasma beam.

Another problem in the art is that no satisfactory method of obtaining multi-layer coatings is described. At present, to obtain a multi-layer coating on a substrate requires either two separate coating machines, one for producing each individual layer of the multi-layer coating, or the depositing of a first layer using one coating machine and then the dismantling of this machine so as to replace the cathode and then reassembly of the machine to deposit the second layer of the multi-layer coating.

Where the coating is a composite of metal and gas atoms, such as aluminium oxide or silicon dioxide coatings, this is achieved in the art by creating a plasma beam of metal ions, depositing these on the substrate and reacting the deposited ions with the gaseous component, such as oxygen, of the coating. These prior art techniques are rather inefficient in that they use large volumes of gas. An improved method of producing coatings of this nature is required.

SUMMARY OF THE INVENTION

It is an object of aspects of this invention to provide an improved apparatus for and method of depositing coatings of positive ions on a substrate, the positive ions obtained via arc evaporation of a cathode target. Another object is to improve the efficiency of filtering a plasma beam from a cathodic arc so as substantially to remove all macroparticles from the filtered plasma beam. A further object is to provide a filtered cathodic arc source that can be operated efficiently at a high vacuum and substantially without contamination of the deposited coating by macroparticles. A still further object is to provide improved multi-layer coating of substrates using a filtered cathodic arc. Yet another object is to provide for coating of dielectric substrates, such as dielectric optical substrates, using a filtered cathodic arc. A still further object is to provide improvements in arc ignition of a filtered cathodic arc. Another object is to reduce gas use when depositing a coating having a metal and a gaseous component. Yet another object is to overcome or at least ameliorate problems identified in prior art methods and apparatus.

A first aspect of the invention relates to improved filtering of macroparticles from a plasma beam of positive ions.

According to a first aspect of the invention there is provided a method for filtering a plasma beam including positive ions, the method comprising generating a plasma beam including positive ions from a cathode target, and passing the beam through a plasma duct towards a substrate, the plasma duct having a double bend. Typically, the duct has a first bend with an angle of no less than 20° in a first plane and a second bend with an angle of no less than 20° in a second plane.

The first and second planes are optionally co-incident. Though it is preferred that the first and second planes are not co-incident but are at an angle to each other, such as at least 15 degrees, more preferably at an angle of between 30–90° to each other.

It is preferred that the duct is toroidal. A specific embodiment of the invention described below has a toroidal duct, and from a practical point of view vacuum tubing for construction of a duct of the invention is available commercially in toroidal sections. The invention nevertheless encompasses ducts of different cross-sections.

It has been found that, using the plasma duct of the first aspect of the invention, it is possible substantially to remove all macroparticles from the plasma beam. Prior art duct designs have incorporated a single 45° or 90° bend. These have not totally prevented macroparticles from reaching the substrate but instead allow significant contamination of the deposited layer by macroparticles. Although there is not a line-of-sight from the cathode to the substrate in prior art apparatus there is nevertheless a single bounce path possible for macroparticles which are thus able to reach the substrate after a single bounce on an inner surface of the plasma duct. The plasma duct of the first aspect of the invention incorporates two bends and these confer significantly improved filtering of macroparticles from the plasma beam.

In order for a macroparticle to reach the substrate via the plasma duct of the invention, at least two successful bounces off the duct walls must occur. A large amount of macroparticle kinetic energy is lost during each bounce and therefore it is found that the probability of a macroparticle entering the duct with sufficient kinetic energy successfully to undergo a double bounce on the plasma duct walls and to arrive at the substrate is virtually zero.

This is particularly the case where the two bends are in different planes, since the first bend tends to remove particles with momentum suitable for passing through the second.

Therefore it is a considerable advantage of the invention that improved filtering of the beam is achieved and a greater proportion of macroparticles are removed from the plasma beam arriving at the substrate. With the ability to remove the macroparticles in this way, it is not necessary, for example when depositing diamond-like carbon, to increase the pressure in the vacuum chamber, which pressure increase would compromise the properties of the deposited film, and therefore the properties of the deposited film can be greatly improved.

The first aspect of the invention also provides apparatus for generating a substantially pure plasma beam including positively charged ions, the apparatus comprising means for generating a plasma beam including positive ions from a cathode target and a plasma duct located between the cathode target and a substrate, wherein for a macroparticle entering the duct there is no line-of-sight and no single bounce path to the duct exit. The duct has an inner wall and at least two bounces off the wall are needed for a macroparticle to reach the duct exit.

In an embodiment of the invention the duct has a double bend, comprising a first straight section, a first bend, a second straight section, a second bend and a third straight section. Such a duct is illustrated in the examples and, as will be seen, has a serpentine nature. The bend angles in the duct vary independently of each other, provided there is no single bounce path from the entrance of the duct to the exit.

The plasma duct of the apparatus typically has a first bend with an angle of no less than 20 degrees in a first plane and a second bend with an angle of no less than 20 degrees in a second plane. In particular embodiments of the invention the bend angles are, independently, in the range 30–90 degrees, more particularly 35–80 degrees.

Another embodiment of the invention provides apparatus for filtering a beam of positive ions comprising a vacuum chamber, means for generating a beam of positive ions, a filter duct having an entrance and an exit, and means for steering the beam of positive ions into the entrance of the duct and through the duct to the exit, wherein the duct comprises at least two bends. The two bends of the duct are such that, for a neutral particle entering the duct, there is no single bounce path to the exit; instead, at least two bounces off inside walls of the duct are needed for a macroparticle to travel from the duct entrance through the duct and to exit from the duct exit.

In a further embodiment of the invention there is provided apparatus for filtering a beam of positive ions, comprising means for generating positive ions, means for steering positive ions in a beam and a filter, wherein the filter comprises a double bend duct. In a specific embodiment of the invention described in detail below, a cathode arc source, capable of generating positive carbon ions, is located within a vacuum chamber, magnetic means are provided to steer positive ions through the filter and onto a substrate, and the double bend of the filter duct filters macroparticles from positive ions.

A still further, more particular, embodiment of the invention provides a filtered cathode arc source for depositing positive ions on a substrate, comprising

- a vacuum chamber
- means in the chamber for generating positive ions from an arc at a cathode target
- a substrate located on a substrate holder
- a filter duct located between the target and the substrate and through which positive ions from the target pass in order to arrive at the substrate
- means for cooling the cathode
- means for applying a positive bias to the filter duct
- said filter duct having a first bend and a second bend
- means for generating a magnetic field to steer positive ions around the first bend, and
- means for generating a magnetic field to steer positive ions around the second bend In a specific embodiment of the invention described in further detail below, an arc power supply is connected to the source and provides power for both the arc and for arc striking (ignition), achieved using a moveable striker located insider the vacuum chamber. The striker is grounded, as is the arc anode, and is moved towards the target until a tip portion touches or nearly touches the target and ignition occurs. The arc current is around 70–200 amps, and variation in the current varies the rate of deposition of ions on the substrate, though the relation is not linear. Arc voltage is material dependent and for any given arc source set up does not vary outside a fairly narrow range. With a carbon target the arc voltage is typically about 29V.

It is further an option to provide a plasma duct having a single, graduated radius that does not provide a single bounce path between the target and the substrate.

The choice of angles for the double bend plasma duct is to be looked at having regard to both theoretical and practical aspects. Whilst in theory, any combination of angles can be used, so long as the first angle is at least 10°, the second at least 10° and the total preferably at least 50°, in practice a first step is to decide the space angle in light of the size of the duct. An angle of 10° in a duct 6 inches wide is effectively no angle. A larger duct gives increased transmission but has to be longer in order to avoid a line-of-sight around each bend.

In use, the inventors have found that a duct diameter of between 4 and 6 inches (10 and 15 cm) is particularly suitable. In these ducts, the double bends are arranged so that there is no single bounce path for a macroparticle between the target and the substrate.

A duct diameter of 2–3 inches (5–8 cm) provides effective filtering with small double bend angles, such as 20 degrees and 30 degrees. On the other hand, a duct of such a small size produces a correspondingly narrow plasma beam and loses significant amounts of plasma to the duct wall; consequently it has a poor transmission performance compared to larger diameter ducts. Ducts of these dimensions may therefore be indicated when high filtering efficiency is a priority.

There is also a practical limitation in that the wider the duct the greater the difficulty in providing a magnetic field to steer the plasma. In use, it has been found that ducts having diameters in the 4 inch–6 inch (10 cm–15 cm) range give useable rates of deposition.

In a particular embodiment of the invention, the double bend duct of the apparatus is supplemented by a liner located within the plasma duct. It is preferable that this liner is removable for cleaning purposes. In use, sides of the liner rapidly become coated with a deposit, and, if this is allowed to build up over time, particles from the deposit typically fall back into the plasma beam and contaminate the coating on the substrate. The liner is removable, allowing it to be replaced with a clean liner periodically to prevent this long term deposit from building up on the duct walls. The removed liner can be cleaned remote from the apparatus.

In a particularly preferred embodiment of the invention the liner is positively biased, typically to between 10V–30V. An advantageous effect of this bias is that it creates a repulsion between the liner and the positive ions in the plasma beam and thereby increases the flow of plasma through the double bend of the plasma duct. Thus, any reduction in plasma beam transmission due to the double bend of the apparatus can be at least partially compensated by biasing the duct liner.

In a specific embodiment of the invention, the double bend plasma duct is lined with a liner adapted further to increase filtering of macroparticles from the plasma beam. The liner is made-up of a series of rings having flanges that project outwards into the interior of the duct and are angled backwards and towards the target. The liner is made of a series of rings linked, alternately around their peripheries, for example at 12 o'clock and 6 o'clock, and then at 3 o'clock and 9 o'clock. This liner is flexible and suitable to be pushed into the duct and around the duct bends.

In another particular embodiment of the invention, the apparatus further comprises baffles located at or close to walls of the vacuum chamber of the apparatus and between the cathode target and the plasma duct. It is observed that most macroparticles are emitted from the cathode target at a large angle and these are prevented from hitting the target walls, or entering the plasma duct at a large angle, by the baffles. Macroparticles and plasma emitted substantially normal to the cathode target surface pass through the baffles.

It is preferred that the baffles are non-conducting, e.g. made of PTFE; initial arrival of positive ions establishes a positive charge that exerts an electrostatic repulsive effect against the positive ions in the plasma and increases the flow of plasma including positive ions into the plasma duct. It is particularly preferred that the baffles are removable for cleaning purposes. The baffles quickly become coated in use with a fine, particulate coating and if this is allowed to build up over a long time it can contaminate the plasma beam. Baffles that are removable can be immediately replaced with clean baffles and the dirty ones can be cleaned remote from the apparatus.

In use of the filtered cathode arc source of the invention, it is desirable to provide as short as possible a mean free path for carbon ions in the plasma beam. This can be achieved by providing a vacuum pressure that is suitably high, typically of the order of $10^{-6}$ Torr, though during deposition this pressure may typically be around $10^{-5}$ Torr or even slightly less if gas is let into the vacuum chamber. In typical operation, the vacuum chamber is pumped down to about $2 \times 10^{-6}$ Torr and during deposition the pressure may rise slightly towards $10^{-5}$ Torr. The mean free path of particles in the plasma beam can further be reduced by providing and designing apparatus having as short as possible a distance between the cathode target and the substrate.

The plasma beam is guided through the plasma duct by methods and apparatus known in the art. For example, the beam can be guided by a curvi-linear magnetic field along the length of the duct. Alternatively, the plasma beam is guided by a crossed electric and magnetic field. Coils, when provided on the plasma duct double bends, to provide the magnetic steering field for the plasma beam, are optionally water cooled. Permanent magnets are another option.

Using the apparatus of the invention, it is possible to achieve a deposition rate of up to about 15 angstroms per second over an area of 25 in$^2$ (157 cm$^2$) using an arc current of about 120 A and having a floating duct bias. The magnetic field from the coil current, i.e. the field inside the double bends, is about 60 mT on the straight pieces between the bends and about 40 mT on each of the two bends.

The macroparticle count of TAC films produced using the method and apparatus of the invention have been measured and found to be less than 100 per cm$^2$ in a coating 600 angstroms thick. These values compare favourably with those in U.S. Pat. No. 5,401,543, in which examples 1–3 disclose particle counts of about 15,000 per cm$^2$ for a coating of thickness 500 angstroms. This latter figure is a typical figure for the level of macroparticles in films of the prior art.

A second aspect of the invention relates to the application of a coating of positive ions onto an optical element. According to the second aspect of the invention there is provided apparatus for applying a coating of positive ions to a dielectric substrate, the apparatus comprising:

means for generating an arc at a cathode target, the cathode target containing the ions to be deposited on the dielectric substrate, magnetic means for directing a beam of ions emitted from the cathode along a filter path substantially to remove macroparticles therefrom, means for holding the dielectric substrate in the filtered ion beam, means for applying an RF bias to the dielectric substrate to dissipate electrostatic charge accruing on the dielectric substrate by deposition of positive ions.

Whereas prior art coatings were not considered of sufficiently high quality to obtain optical and electronic coatings, the filtered plasma beam of the invention is of such purity that high quality coatings suitable for optical use can be obtained.

Examples of these coatings include tetrahedral amorphous carbon (TAC) and silicon coatings, and oxides, nitrides, selenides and carbides, such as silicon dioxide, aluminium oxide, titanium oxide, titanium nitride.

In an embodiment of the second aspect of the invention, there is provided apparatus for depositing a multi-layer coating of positive ions on a dielectric optical element, the apparatus comprising a first cathode target and further comprising a second cathode target and means for interchanging the first and second cathode targets without breaking vacuum in the apparatus. In use a first coating of ions from the first target is applied, targets are changed without breaking vacuum and then a second coating of ions is applied from the second target. The filter path optionally includes a double bend toroidal duct adapted substantially to remove macroparticles from the plasma beam.

The duct conveniently incorporates the first aspect of the invention. In a particular embodiment of the second aspect of the invention, the duct is lined with a liner, preferably a non-magnetic liner. More preferably the liner is removable from the duct for cleaning. In another embodiment, the liner is given a positive bias, preferably within 10V–30V.

The invention enables deposition of a film of TAC that is substantially, and can potentially be entirely, free of macroparticles. This film can be obtained without the need to introduce into the vacuum chamber a gas to prevent formation of macroparticles, which gas routinely leads to a deterioration in the properties of the deposited TAC. Also, in other applications operation using reduced gas volume is made possible. The TAC coatings of the invention can be deposited with the following characteristics:

| | |
|---|---|
| (a) smoothness | root mean square of 3 angstroms average deviation from surface, for a TAC coating deposited on a polished silicon surface. |
| (b) hardness | 65 GPa (this compares to a value of 100 for pure diamond). Typical hardness for the TAC coatings is in the range of 55–75 GPa, for a film on silicon. The sp$^3$ content of films of the invention is typically at least 80%, and in embodiments of the invention is typically at least 85%, and in some specific embodiments as high as 88%. The increased sp$^3$ content of films of the invention compared to prior art films gives increased hardness. For example, the films produced by the equipment of Falabella et al (US-A-5279723) are reported to have sp$^3$ content of around 60%. |
| (c) refractive index | 2.5–2.6 (compared to the value for diamond of 2.4). |
| (d) optical band gap | approximately 2 eV. |
| (e) transmittance | 70% in the infra red spectrum. |
| (f) Young's modulus | 700 GPA, typically 600–800 (compared to 1010 GPA for diamond). |
| (g) friction coefficient of sapphire of TAC film of approximately 0.15. | |
| (h) density | 3 g/cubic cm. The density of pure, natural diamond is normally 3.5 g/cubic cm. The density of TAC films of the invention is typically at or above 3 g/cm$^3$ and preferably 3.2–3.3 g/cm$^3$ or above. Prior art publications have reported diamond like carbon films having a density of around 2.7 g/cm$^3$. |

It is a particular advantage that the TAC films of the invention posses these characteristics and that the films do not compromise any of these characteristics as a result of efforts to remove macroparticles from the films. Macroparticles are substantially entirely removed by the improved filtering of the invention, so all these characteristics can be obtained in the deposited film. It is particularly noticeable that the TAC films of the invention do not absorb at wavelengths associated with C-H IR absorption, indicating no hydrogen in the TAC films.

A further aspect of the invention accordingly provides a TAC film possessing the above-identified film characteristics. The film depth is typically 50–1000 angstroms.

In a third aspect, the invention relates to obtaining multi-layer coatings on a substrate. By multi-layer coating it is intended to indicate that the substrate has a first coating of one material, such as silicon dioxide and a second coating of a different material, such as aluminium oxide. Multi-layer coatings are of particular use in the optical and electrical field in which the combination of properties obtained by the individual coatings produces an overall property of the coating which is of a particular application.

A third aspect of the invention provides a cathodic arc source for generating a plasma beam from a cathode target, comprising:

a vacuum chamber, a first cathode located at a cathode station within the chamber, means for generating an arc from the cathode at the cathode station, a second cathode located within the chamber, and means for interchanging the first and second cathodes without breaking vacuum.

Known cathodic arc sources incorporate a single cathode target. To produce multi-layer coatings it is normally necessary to break vacuum in the chamber, replace the cathode target, pump down to re-establish vacuum in the chamber and then apply the second coating layer. As will be appreciated, the third aspect of the invention enables multi-layer coatings to be obtained without the expensive and time consuming step of breaking and then re-establishing vacuum in the chamber.

It is known to provide a first coating layer of a metal in combination with one gas and then a second coating layer of the same metal and a second gas. For example, a silicon nitride coating may be applied on top of a silicon dioxide coating. Other such combinations will be known to those skilled in this art. To obtain such a multi-layer coating the cathode target is made of the same material. However, once a cathode target has been used with a first gas then it becomes contaminated with traces of that first gas. When that same contaminated cathode is used with a second gas, the initial plasma beam from the cathode is contaminated with ions of the first gas. In this circumstance, the third aspect of the invention is also of advantageous use because the first cathode can be exchanged with a second cathode of the same material, but the second cathode is not contaminated with the first gas. Again, this exchange is achieved rapidly and efficiently without breaking vacuum in the chamber.

The second cathode can be one of a plurality of cathodes, the source comprising means for interchanging the first cathode with any of the plurality of cathodes without breaking the vacuum. Optionally, the second cathode is located in a cathode magazine.

In a particular embodiment of the third aspect of the invention there is a vacuum lock between the cathode magazine and the cathode station.

The vacuum chamber advantageously may further comprise first and second vacuum compartments; the cathode magazine is located within the second vacuum compartment; the cathode station is located within the first vacuum compartment; and the source comprises means for separate evacuation of the first and second vacuum compartments. It is preferred that the second compartment comprises a port allowing-access to the cathode magazine without breaking vacuum in the first compartment.

In use of this particular embodiment, an operator is able to gain access to cathodes in the cathode magazine without breaking vacuum in the chamber holding the cathode from which an arc is to be generated. This enables convenient exchange of cathodes into the magazine without the time-consuming need to break and re-establish vacuum in the main chamber in the apparatus. The time taken to replace an exhausted cathode in a continuous coating process is reduced and multi-layer coating of substrates is greatly facilitated.

In a particular embodiment of the invention to be described further in detail below, the cathode interchanging means comprises a cathode gripping device mounted on a target transport arm and adapted to transfer a cathode between the cathode station and the cathode magazine.

A fourth aspect of the invention relates to coatings such as silicon dioxide or aluminium oxide that have metallic and gas components.

According to a fourth aspect of the invention apparatus for applying a coating of positive ions to a substrate comprises:

means for generating an arc at a cathode target, the cathode containing one component of the coating, means for introducing into the arc a gas component of the coating, and magnetic means for directing a beam of ions via a filter path to the substrate, the filter path adapted substantially to extract macroparticles from the ion beam.

This apparatus enables gas ionisation to occur in the arc. Conveniently, the gas introducing means comprises a gas inlet proximal to the cathode.

Ionisation in the plasma ball of the cathode arc is fierce. Thus, gas introduced into the arc is rapidly and efficiently ionised and contributes positively charged gas ions to the plasma beam. By prior calibration of the rate of gas input a plasma beam is obtained containing metallic positive ions and gas positive ions in a suitable stoichiometric ratio to produce a composite metal-gas coating on the substrate. The fourth aspect of the invention enables highly efficient use of gas and can be adapted to ensure that gas use is at the most efficient level to obtain the required composite gas-metal coating on the substrate.

Apparatus according to the fourth aspect further removes the requirement for there to be a gas inlet close to the substrate or as part of the plasma duct, thereby simplifying construction of the substrate holder and of the plasma duct.

Examples of suitable gases for obtaining gas-metal composite coatings include oxygen, nitrogen, hydrogen and methane.

Introduction of gas into the arc of the cathodic arc source can advantageously be combined with other aspects of this invention described above. In a particular embodiment of the fourth aspect of the invention, the cathode is a first cathode located at a cathode station, the station being positioned so that an arc can be generated from a cathode located at the station, the apparatus further comprising a second cathode located in a cathode magazine, the apparatus further comprising means for interchanging the first cathode with the second cathode without breaking vacuum in the vacuum chamber.

Apparatus according to the fourth aspect can be adapted for applying multi-layer coatings to the substrate, one layer of the coating comprising ions from the first cathode and another layer of the coating comprising ions from the second cathode, the multi-layer coating achieved without breaking vacuum in the vacuum chamber.

A fifth aspect of the invention relates to arc ignition avoiding drawbacks of previously available igniters.

A fifth aspect of the invention provides apparatus for applying a coating of positive ions to a substrate, the apparatus comprising:

means for generating an arc at a cathode target, means for directing a beams of ions emitted from the cathode to the substrate, via a filter path substantially to remove macroparticles therefrom, and arc ignition means comprising an ignition anode retracted towards a wall of the apparatus and movable between this retracted position and an ignition position in contact with the cathode surface, and means for storing the position at which arc ignition occurred.

It is preferred that movement of the arc ignition means is by a stepper motor, giving accurate control.

An embodiment of the invention described below includes arc ignition means that comprises means for moving the ignition anode towards the ignition position, means for determining arc ignition and means for returning the arc ignition means to its retracted position after the arc has ignited. It is an option for the ignition anode to be on the end of an igniter arm, the other end of which is rotatably mounted on the apparatus.

In use, if a first arc ignition position is known, in subsequent arc ignition the ignition anode is moved directly to this position and thereafter moved towards an ignition position of the cathode.

On first ignition of an arc from a cathode target, the arc ignition means is typically moved towards the cathode at a slow rate, the operator attempting to avoid contact with the cathode target that would impact upon the target and risk damaging the target. Once an arc is ignited from a cathode then the position of arc ignition can be noted. Subsequent ignition of the same cathode is achieved conveniently by moving the anode on the arc ignition means towards the known first ignition position and thereafter slowly moving the anode towards a position in which subsequent cathode ignition occurs. As a cathode is consumed during use it is usual for subsequent ignition of the cathode to occur at a lower position than the position of first cathode ignition.

In an embodiment of the invention a controlling circuit monitors both the arc voltage and the movement of the arc ignition means. The controlling circuit advances the arc ignition anode towards the cathode and when arc ignition is sensed by change in the arc voltage the controlling circuit retracts the arc ignition anode away from the cathode.

Thus, the arc ignition means of the fifth aspect of the invention provides a convenient way to re-ignite an arc from a partially consumed cathode. The problems of prior art ignition devices that often led to contamination of the cathode or required an observer to look through a substantially opaque viewing window are overcome.

It has been observed that ignition of the arc using the igniter of the invention can be achieved at a vacuum pressure of $10^{-4}$ torr. As is known in the art, this vacuum level is suitable for some coatings but for obtaining coatings of exceptional hardness and uniformity a higher vacuum is routinely required.

Apparatus of the invention enables the production of coatings known in the art with improved coating properties due to the improved purity thereof.

As will be appreciated, preferred particular embodiments of the invention combine the various aspects of the invention in all possible combinations. A very particular, specific embodiment of the invention combines all of the aspects of the invention in a single filtered cathodic arc source.

In another embodiment of the invention, the cathode target is arranged substantially horizontally, with the plasma beam of positive ions emitted substantially vertically therefrom. The cathode target is retained by a guide. This arrangement allows the cathode target to melt during preparation of the cathodic arc and therefore this embodiment of the invention is suitable for use with low-melting point targets such as copper and aluminium.

Prior art cathodic arc sources were not suitable for use with low-melting point targets for various reasons. Firstly, the layout of the cathodic arc source forced the target to be held vertically or at an angle to the horizontal, so that if a low-melting point target were used it would melt and flow away from the cathode station and drip on to the walls or the bottom of the source. Secondly, production of macroparticles from a molten cathode target is higher than from a solid cathode target. The prior art devices did not provide an efficient enough filter of macroparticles to enable acceptable quality coatings of low melting point metals to be obtained from a molten cathode.

In some isolated instances, prior art devices have produced coatings of aluminium, however these have been produced using a pulsed cathodic arc source, as continuous use of the arc would result in melting of the cathode target. Using a water-cooled anode according to a further embodiment of the invention, and using the cathodic arc source for periods of up to 2, even 5 minutes, coatings of low-melting point cathodes can be obtained using the apparatus of the invention. Thus, a whole new field of coating technology has been opened up by this invention.

In a particularly preferred embodiment of the invention, the filtered cathodic arc generates pure plasmas to deposit dense and clean thin films. The plasma is emitted from cathodic arc spots on the surface of a consumable cathode and guided by a radial electric field and a curvilinear axial magnetic field through a positively biased double bend toroidal duct to a substrate in a coating vacuum chamber. Unwanted macroparticles emitted with the plasma from the cathode are effectively filtered out by a set of removable ceramic baffles, a removable stainless steel bellows and a double bend toroidal duct. The clean plasma beam virtually without macro-particles at the exit of the duct can be scanned in one dimension by a beam scanning system. This scanned beam, in combination with a rotating substrate holder in the coating vacuum chamber, can deposit a large area of films with good uniformity at room or any other desired substrate temperatures. Ions of the deposited material with a desired energy can be extracted from the plasma beam by using a DC or RF bias on various types of substrates, such as metals, semiconductors, plastics, ceramics and glasses.

The plasma beam from the filtered cathodic arc source of the invention is suitable for room temperature coating of substrates, thus enabling coating of an almost unlimited range of substrates.

BRIEF DESCRIPTION OF THE DRAWINGS

There now follows a brief description of specific embodiments of the invention, illustrated by drawings in which:

FIGS. 7 and 9—transmission; FIGS. 8 and 10—filtering);

DETAILED DESCRIPTION OF THE PREFERRED EMBODIMENTS

Example 1

1) Cathode Assembly

Figure 1:
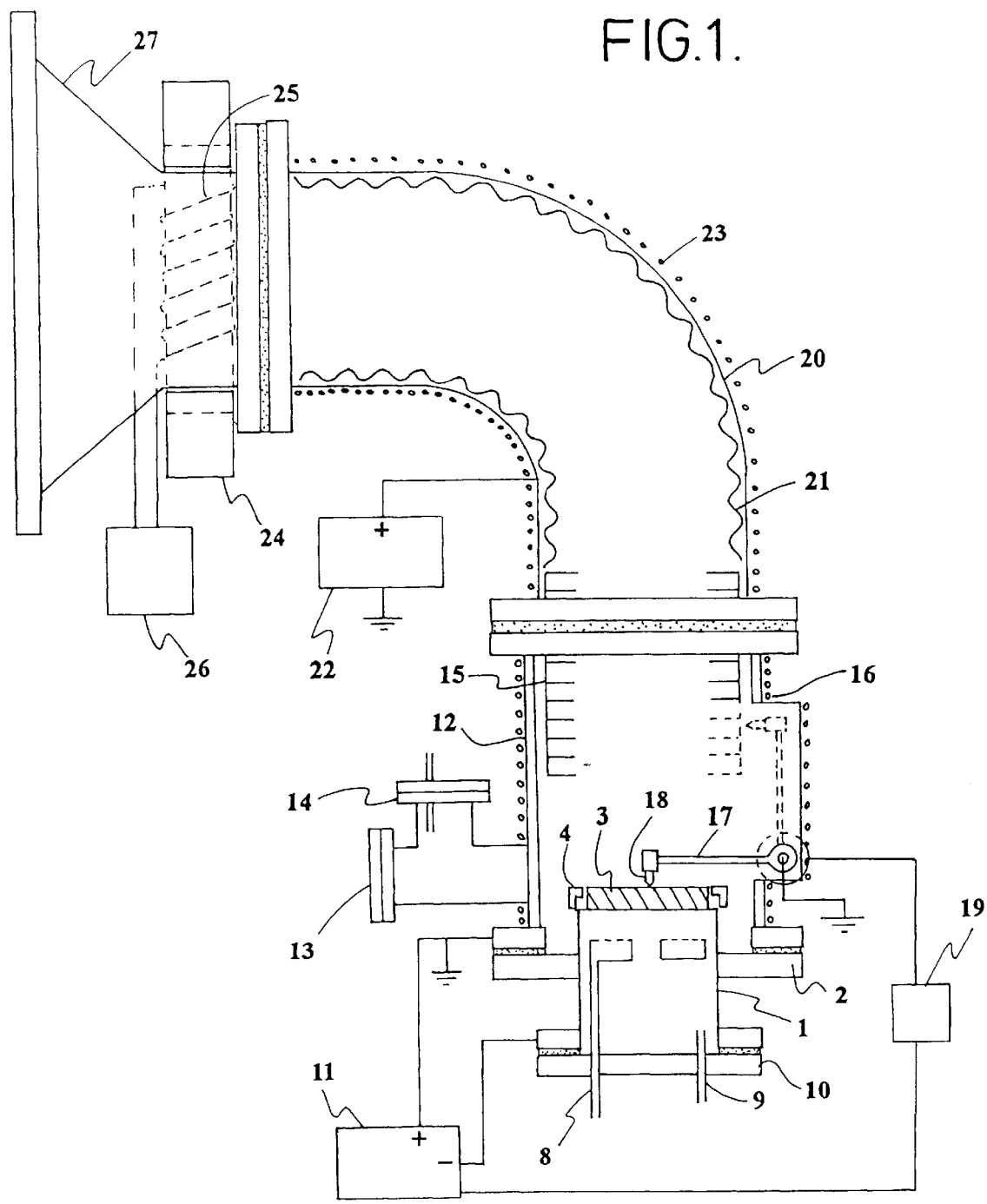
FIG. 1 shows a schematic side view of a filtered cathodic arc assembly of the invention.

Referring to FIG. 1, the cathode assembly is made up of a water cavity block (1) with a mounting flange (2). A consumable cathode target (3) is located on the top of the water cavity block (1). The cathode target is surrounded by a ceramic guard ring (4) that prevents the arc spots on the target surface from migrating off the target surface (3).

The cooling water goes in from the water inlet (8) and returns through outlet (9) to cool the whole cathode assembly. The water inlet and outlet are mounted on a base flange (10) that is electrically insulated from the cathode.

The cathode assembly is mounted onto the anode assembly by the electrically insulated mounting flange (2). The cathode assembly is electrically connected to the negative terminal of an arc power supply (11) and is vertically mounted so that the low melting point materials can also be used as cathode targets (3).

2) Anode Assembly

The anode assembly is made up of a straight piece of duct with a water jacket (12) known in the art for cooling. Located between and electrically insulated from the cathode assembly and the double bend filtering system, it is electrically grounded and connected to the positive terminal of an arc power supply (11).

A view port (13) is placed in the vicinity of the target (3). An orthogonal placed gas inlet port (14) is located beside the view port (13). The gas in the target area (3) undergoes maximum ionization by the plasma spot. The reactive or doping gas can be input from the gas inlet port (14) to achieve maximum ionization, hence highest reaction rate or doping efficiency.

A set of removable ceramic baffles (15) are located in the upper part of the anode assembly. They are used for three reasons: firstly, to prevent some of the macroparticles from rebounding off the wall and entering the filtering system, secondly, to reduce the loss of positive ions to the wall, thus to increase the plasma throughput, thirdly, the baffles are removable so that built up materials can be easily cleaned off.

The magnetic coil (16) around the anode creates an axial magnetic field that focuses the plasma beam and guides it into the next stage, the filtering system.

3) Automatic Arc Triggering System

The automatic arc triggering system is located on top of the anode assembly seen as a bulge. It is made up of a striker (17), a triggering tip (18), a stepper motor (not shown in the figure), and a controller (19). There is a narrow opening on the water jacket wall of the anode (12) to allow the striker (17) to descend to the target (3).

At the start of the triggering, initiated by the controller (19), the striker (17) rotates towards the surface of the target (3) while the controller (19) continuously monitors the change of the status in arc power supply (11). When the triggering tip (18) touches the target surface (3) and subsequently the arc is ignited, the controller (19) senses the change in arc power supply (11) and lifts the striker (17) away from the target surface (3) and away from the plasma beam to avoid contaminating the plasma. The position of the triggering tip (18) at arc ignition is stored by the controller. When re-ignition is required the controller is able to drive the triggering tip (18) rapidly to the stored position without risk of fracturing the cathode target. Any further movement necessitated by evaporation of the cathode target, can be at a much slower rate.

4) Filtering System

Figure 2:
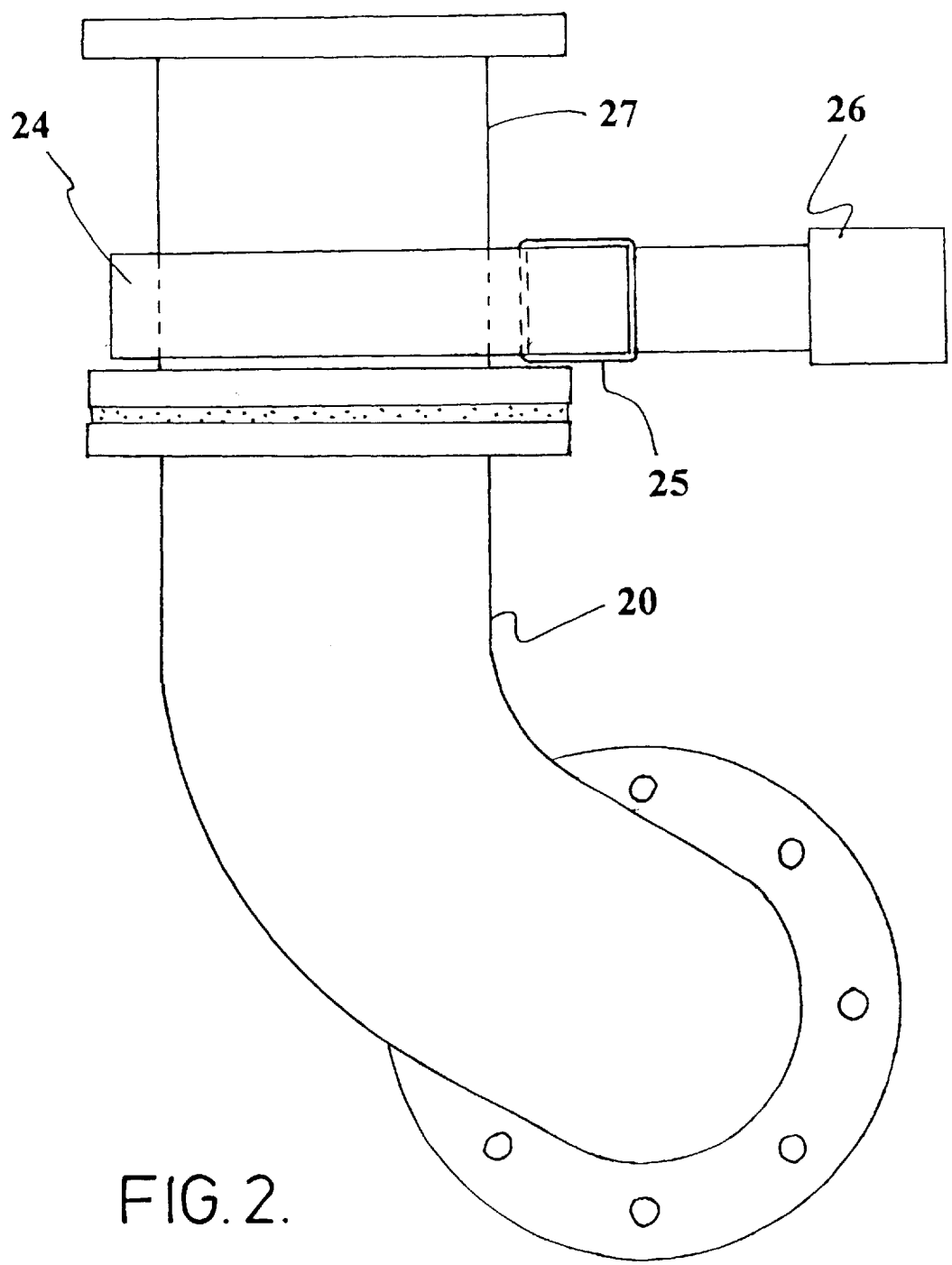
FIG. 2 shows a schematic top view of a Plasma Beam Scanning System and a double bend duct of a filtered cathodic arc of FIG. 1.

Referring to FIG. 2, the filtering system comprises a double bend toroidal duct (20) and a removable stainless steel bellows (21) (shown in FIG. 1) fitting well inside the wall of the duct, which is mounted between and electrically insulated from the anode assembly and plasma beam scanning system.

The bias power supply (22) gives positive bias to the duct (20) and produces the radial electric field within the plasma beam across the axial axis. It is seen from computer simulations that an appropriate radial electric field is very important in efficient transportation of a plasma beam. The magnetic coil (23) generates a curvilinear axial magnetic field along the duct. This crossed electric-magnetic field efficiently guides the plasma through the double bend and effectively filters out unwanted macroparticles coming into the filtering system and neutral atoms. A removable duct liner (21) can enhance the filtering efficiency. It is again removable to allow for easy maintenance of the duct. Eventually, only a pure plasma beam with known ion energy will exit from the filtering system. It is this pure plasma beam that can produce a large variety of thin films with high quality and/or unconventional properties.

5) Plasma Beam Scanning System

Referring to FIGS. 1 and 2, a magnetic plasma beam scanner is located after the filtering system. The scanner is made up of a C-shaped soft magnetic core (24) with two open poles on the top and bottom of the straight duct (25). There is a solenoid around the magnetic core with an electronic driving unit (26) to generate a magnetic field between the two poles. This magnetic field deflects the plasma beam. A varying magnetic field sweeps the plasma beam up and down. The following cone-shaped or fan shaped duct (27) is to allow the beam to be scanned. This fast up and down sweeping plasma beam can deposit large areas of films with good uniformity. It is also possible, with an appropriate drive signal to the scanner, to compensate for variations in ion density across the width of the filter output. The plasma beam can be either scanned horizontally or vertically. It can also be scanned both horizontally and vertically if two magnetic scanners are installed. With the plasma beam scanning system there are few limitations to the size of coatings as far as this attachment is concerned. The main limitation arises from the size of the coating chamber.

The ions of the deposited material in the plasma beam can be deposited on various types of substrates, such as metals, semiconductors, plastics, ceramics and glasses, etc. The substrate can be further biased by using a DC or RF bias to extract ions with a desired energy from the plasma beam. The deposition can be carried out at room or any other desired substrate temperature.

6) Multi-Target Changer

Figure 3:
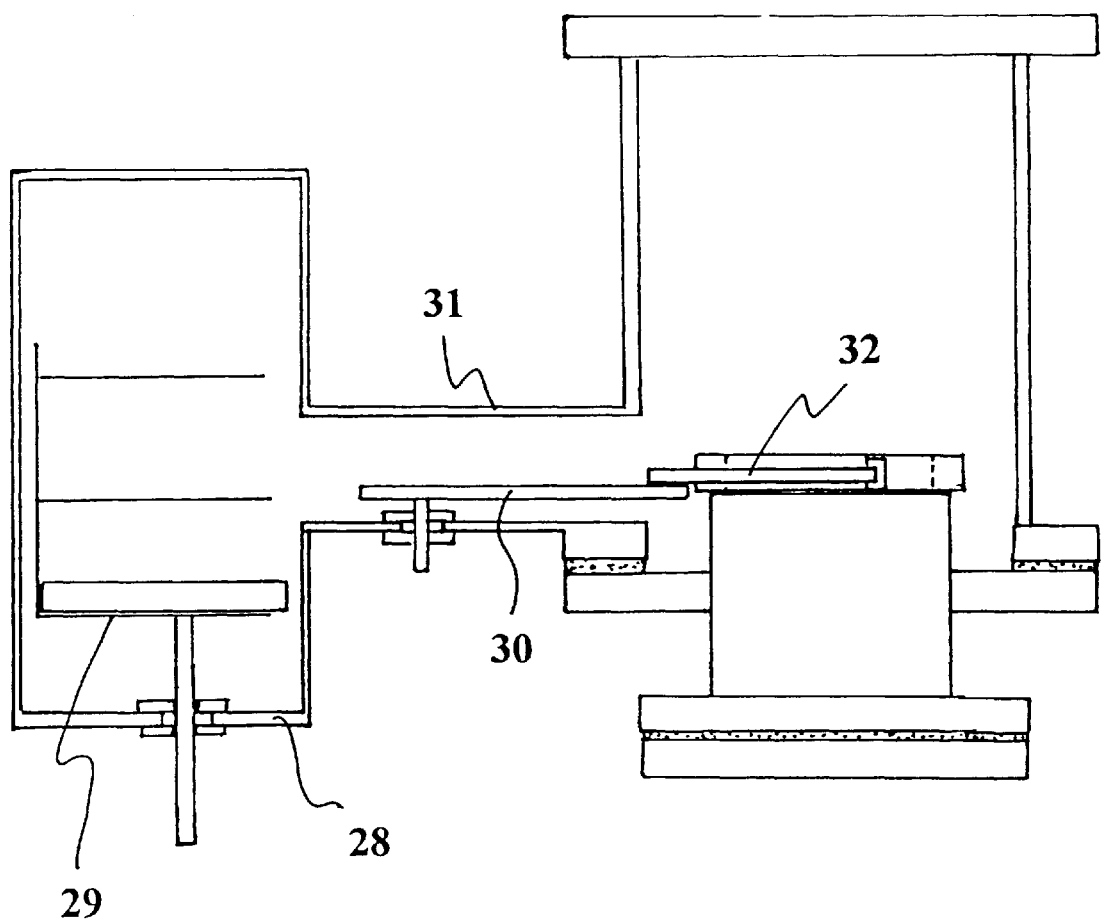
FIG. 3 shows a schematic side view of a multi-target changer with the anode and cathode assembly of the filtered cathodic arc.
Figure 4:
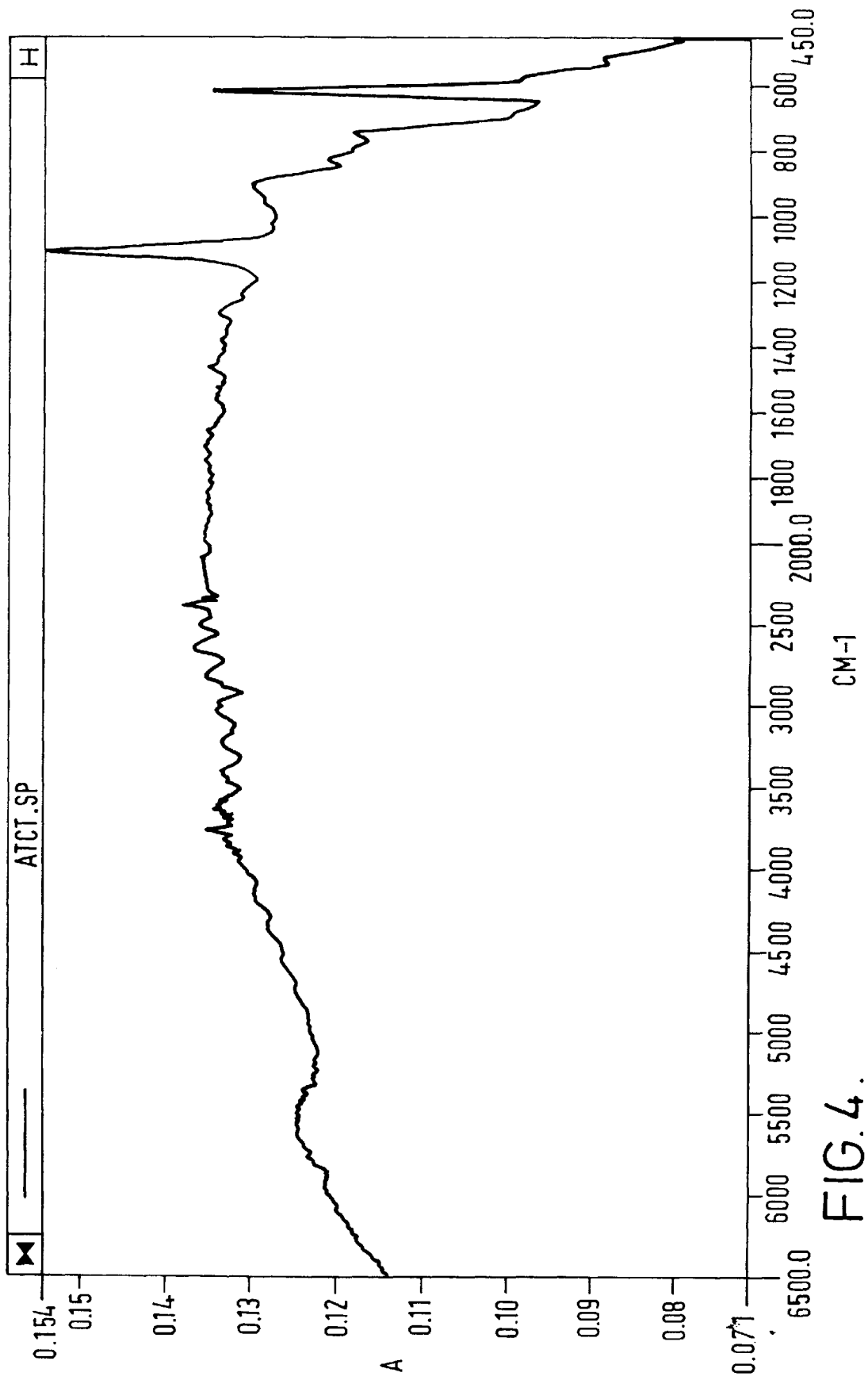
FIG. 4 shows the infra red absorption spectrum of a TAC film of the invention: wave number on the X axis and absorbtion co-efficient on the Y axis, illustrating C-C absorption at about 1210–837 and no C-H absorbtion.
Figure 5:
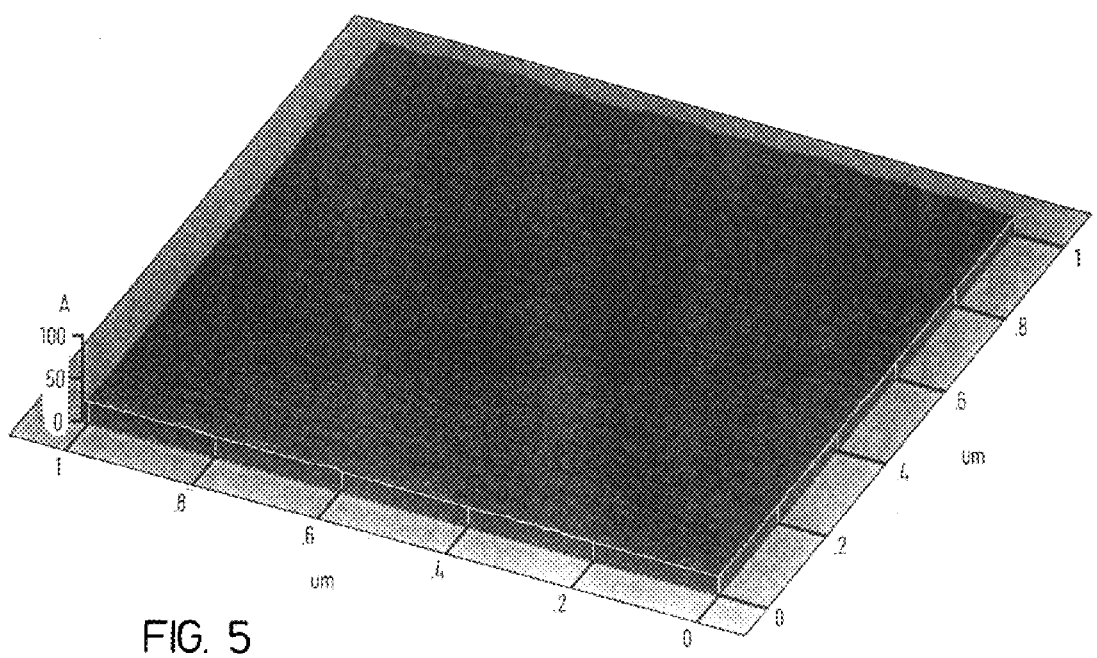
FIG. 5 shows the morphology of a TAC film of the invention under atomic force microscope.
Figure 6:
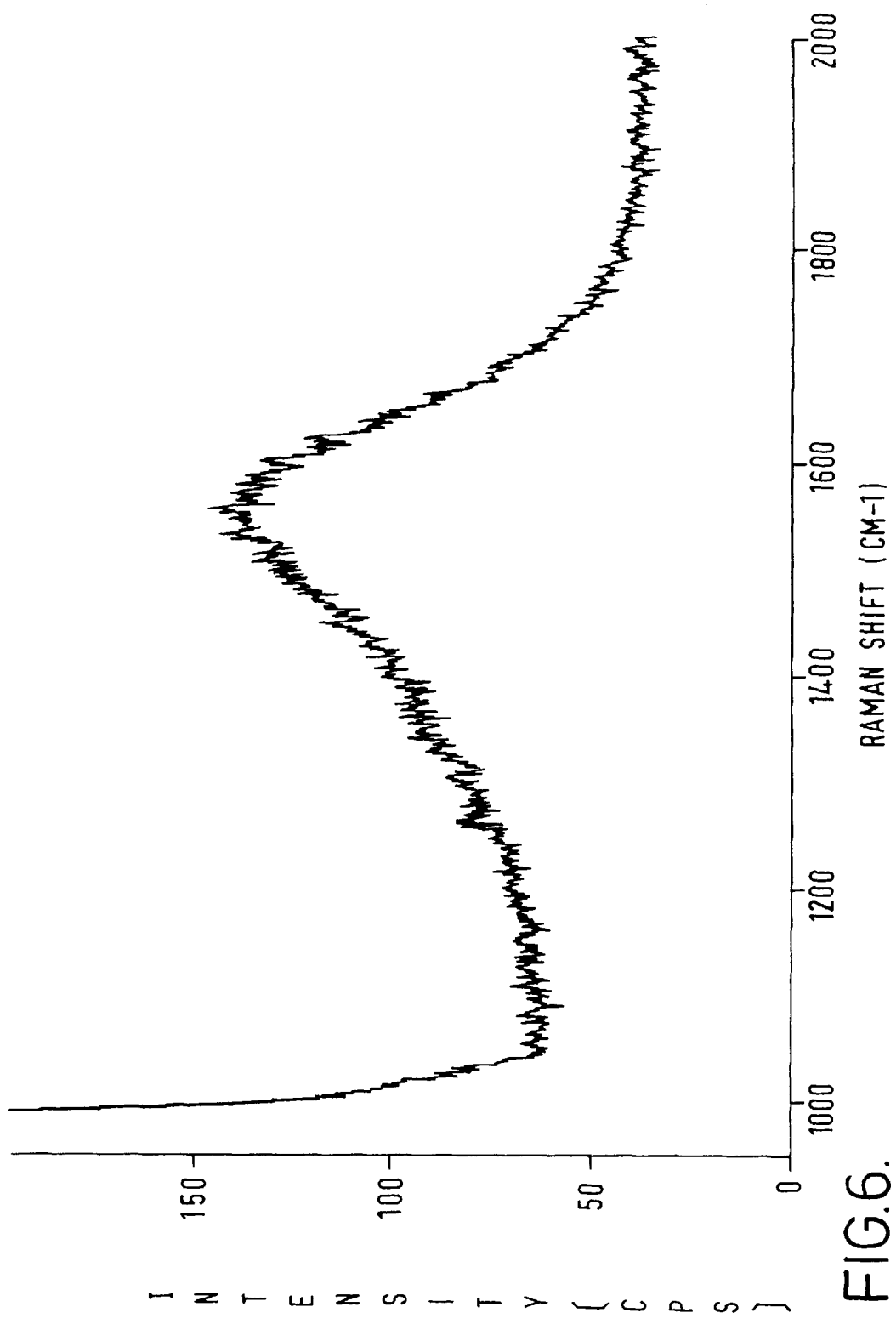
FIG. 6 shows the Raman spectrum of a TAC film according to the invention: the amorphous diamond structure of films of the invention is evidenced by the combined peak at 1400–1600. The X axis shows Raman shift (cm$^{-1}$) and the Y axis shows intensity (cPS).

Referring to FIG. 3, the multi-target changer enables easy and efficient deposition of multi-layer coatings. It is basically a load-lock system comprising of a vacuum chamber (28) with access door to the targets which are stored and indexed in the storage rack (29). A linear transport arm (30), located inside the duct (31) connecting the storage chamber to the anode assembly via a gate valve (not shown in the figure), is used to transfer the targets. A gripper (32) is designed to hold and support the target during the transfer.

Example 2

The electrostatic potential difference between the duct wall and the plasma centre was added to the drift model equations developed by Schmidt and Khizhnyak (Phys. Fluids, 3, 961 (1960) and Soviet Phys.—Tech. Phys., 10 (5), 655 (1965)).

$$m\frac{d}{dt}v_e = -q(E + v_e \times B) + m_{ei}(v_i - v_e) + 2q\phi_0 r_\varphi$$

$$M\frac{d}{dt}v_i = q(E + v_i \times B) + Mv_{ie}(v_e - v_i) - 2q\phi_0 r_\varphi$$

The first terms on the right hand side of these two equations describe the motion of electrons and ions in the electromagnetic field. The second terms describe the accumulative effect of interactions between electrons and ions. The last terms describe the effect of the radial electric field between the duct wall and the centre of the plasma.

These two equations are used to simulate the motion of the plasma in the toroidal duct and used in design of the filtered cathode arc system according to the present invention. The motion of neutral particles in the duct was simulated on a computer according to a specular reflection when a neutral particle hits the duct wall.

The results of these two simulations, namely (1) the effect of variations in the angles of the first and second bends upon plasma transmission through the duct and (2) the effect of variation in these two bend angles upon filtering of macroparticles from the plasma, are illustrated in FIGS. 7, 8, 9 and 10.

Figure 7:
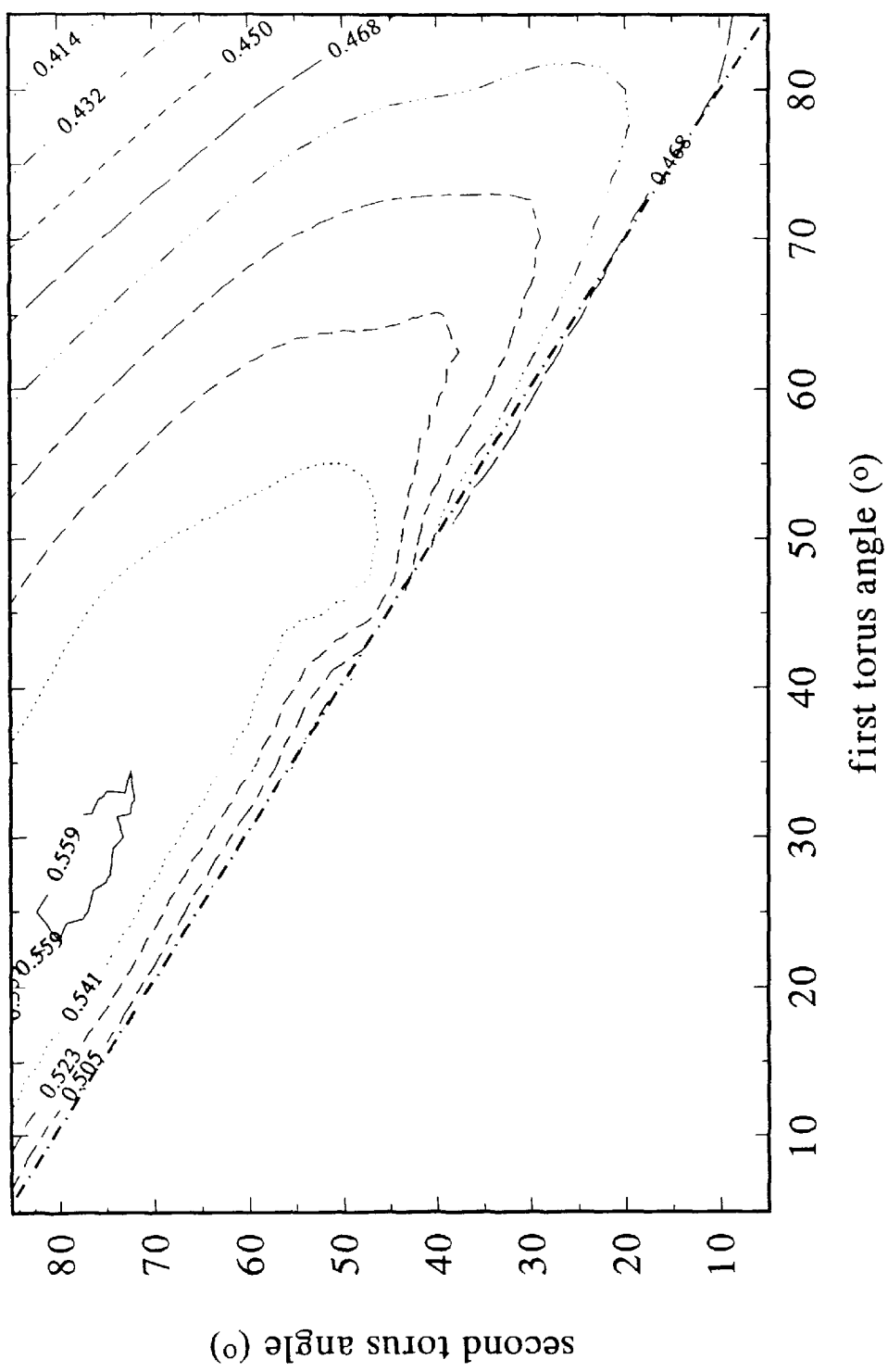
FIGS. 7–10 show calculated transmission and filtering efficiencies of double bend ducts of the invention (x axis—first bend angle; y axis—second bend angle.
Figure 8:
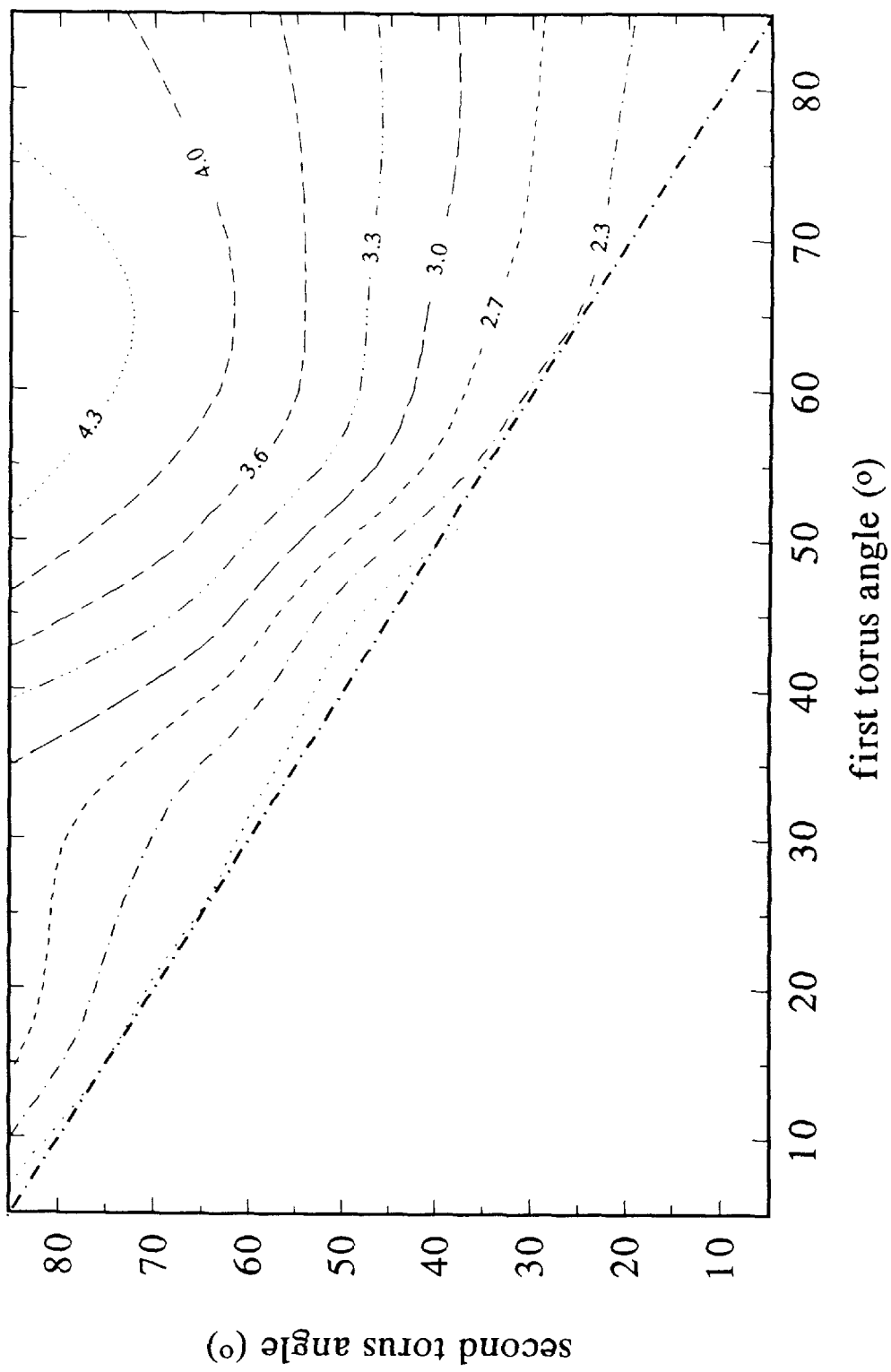
Figure 9:
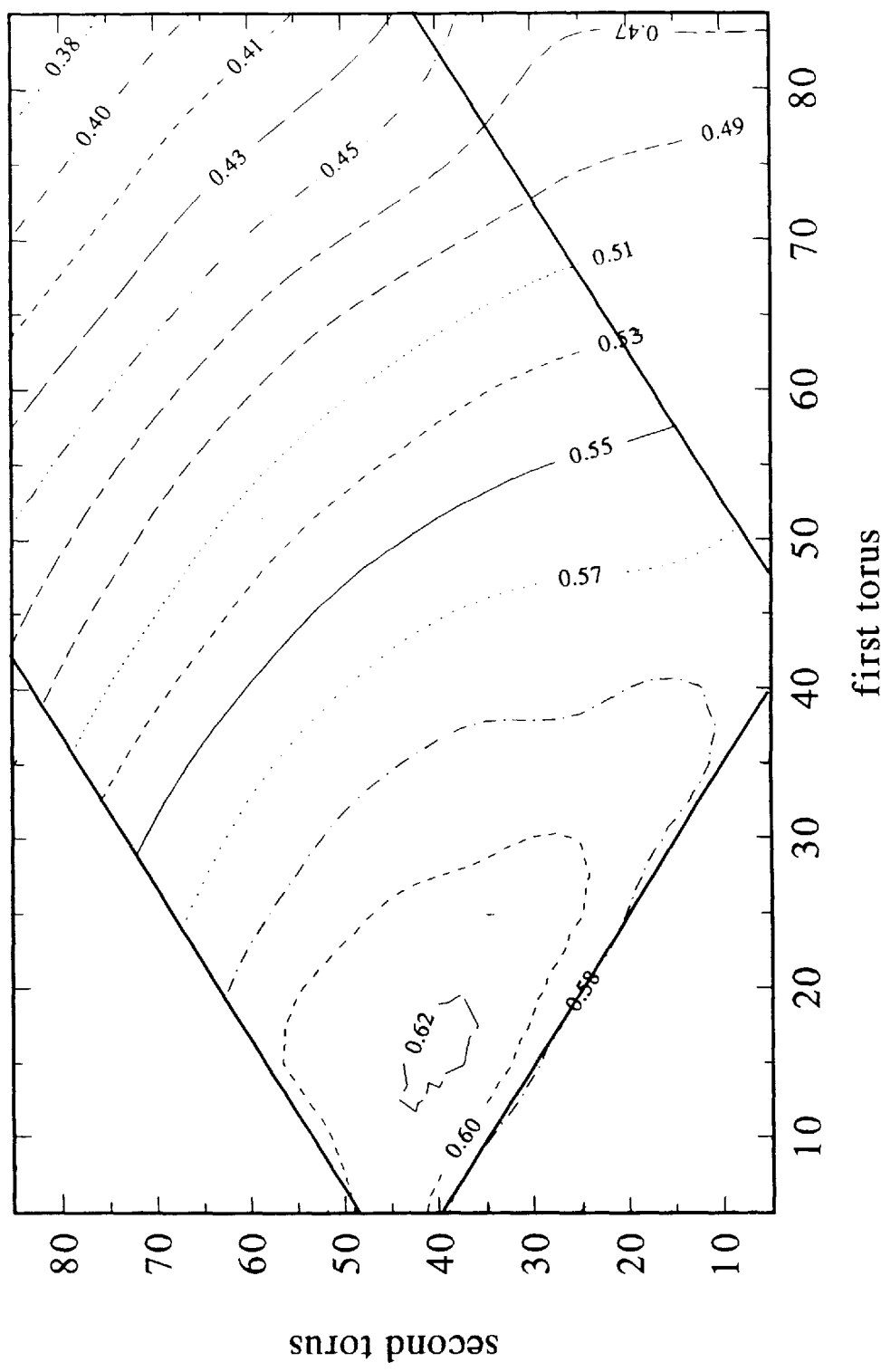
Figure 10:
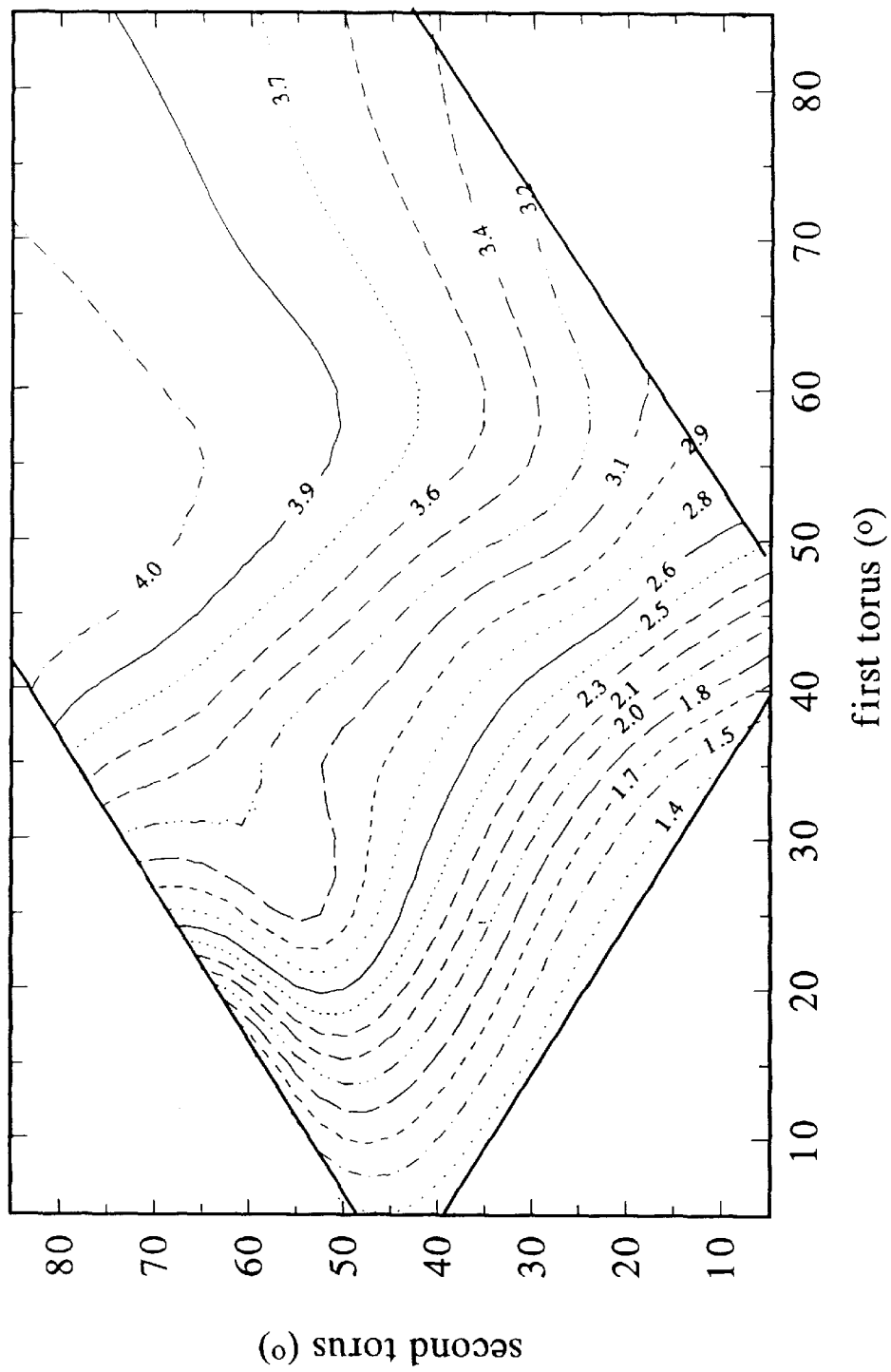

According to the model, a double bend plasma duct of the invention can outperform a single bend in terms of plasma transmission (FIGS. 7, 9) and/or macroparticle filtering (FIGS. 8, 10).

FIGS. 7 and 8 are calculations for a duct in which the angle between the direction of plasma entering and exiting the duct is 90°, that is to say the net effect of two bends in the duct. In FIGS. 9 and 10 the angle is 45°.

Example 3

Figure 11:
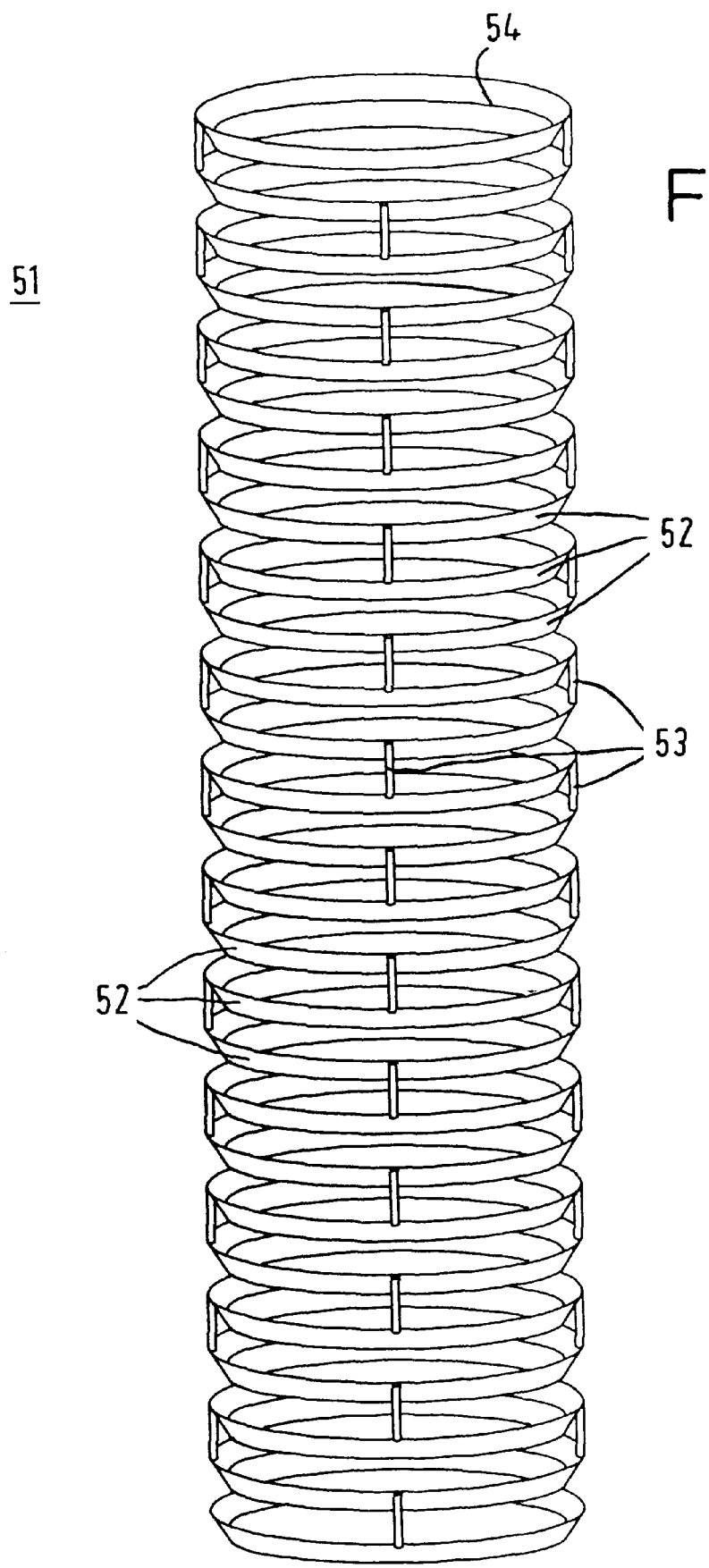
FIG. 11 shows a duct liner of the invention.

Referring to FIG. 11, a duct liner (shown generally as 51) has rings (52) and linkers (53). Each ring is circular in cross-section and has an inner lip (54) extending inwardly and downwardly. In use the liner is arranged within a plasma duct such that this lip is directed towards the target, ie against the plasma flow. The linkage between adjacent rings is by linkers (53) connected to each ring. These linkers are arranged in different places around the peripheries of adjacent rings to give the liner enough flexibility for it to be pushed into a toroidal duct and around the bends of the duct. The liner is made of stainless steel.

Example 4

Referring to FIGS. 12–15, double bend ducts are shown generally as 200.

Figure 12:
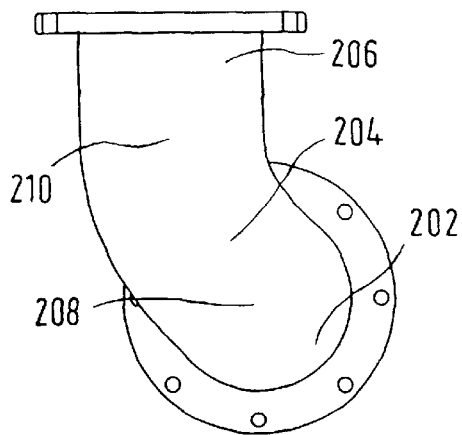
FIGS. 12–15 show double bend ducts of the invention.
Figure 13:
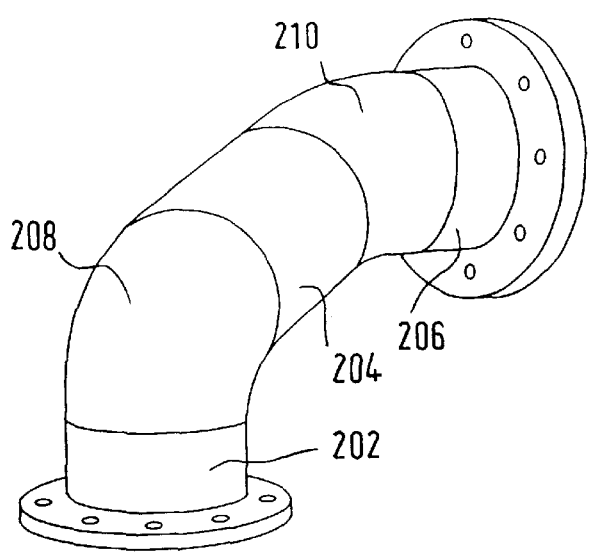
Figure 14:
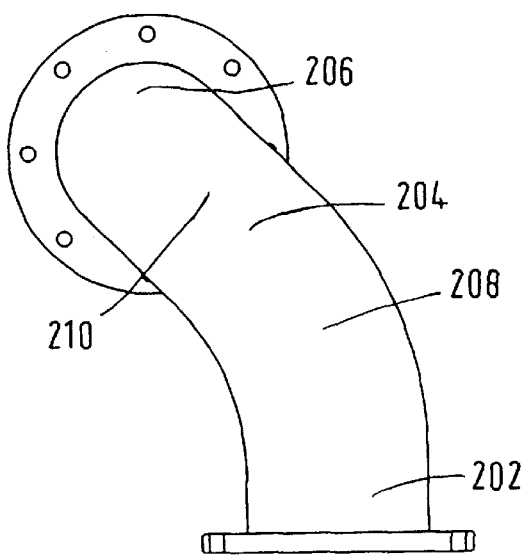
Figure 15:
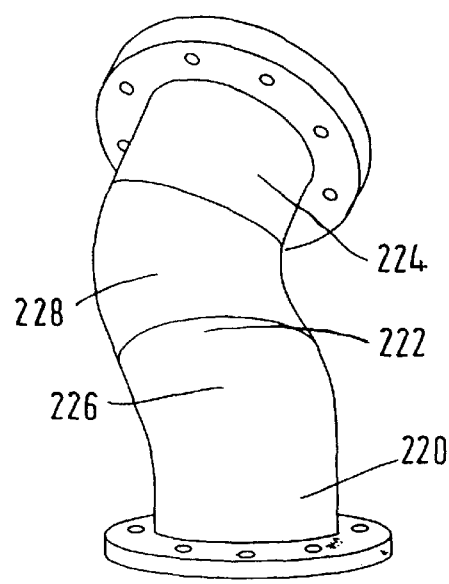

FIGS. 12–14 show a duct in which the angle of plasma entering the duct is at 90 degrees to plasma exiting the duct. FIG. 12 is a view from above, FIG. 13 a perspective view and FIG. 14 a view from the side, all of the same duct. In FIG. 15 that angle is 45 degrees.

The duct in FIGS. 12–14 has straight sections (202, 204 and 206), connected by toroidal bends (208 and 210). The angle of bend 208 is about 50 degrees and of bend 210 is about 60 degrees. There is an angle of 90 degrees between the plane of the first bend and the plane of the second.

The duct in FIG. 15 has straight sections (220, 222 and 224) connected by toroidal bends (226 and 228). Bend 226 has an angle of about 35 degrees and bend 228 an angle of about 40 degrees. There is an angle of 45 degrees between the duct entrance plane and the duct exit plane.

Example 5

Figure 16:
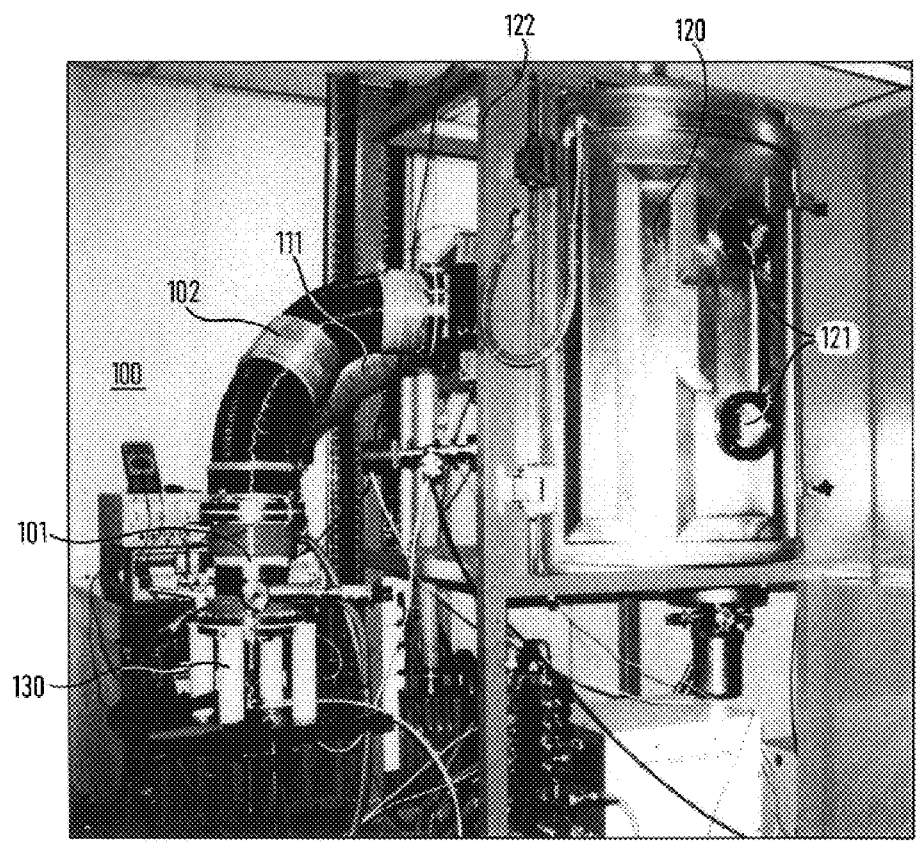
FIGS. 16 and 17 show deposition apparatus incorpoating FCAs according to the invention.
Figure 17:
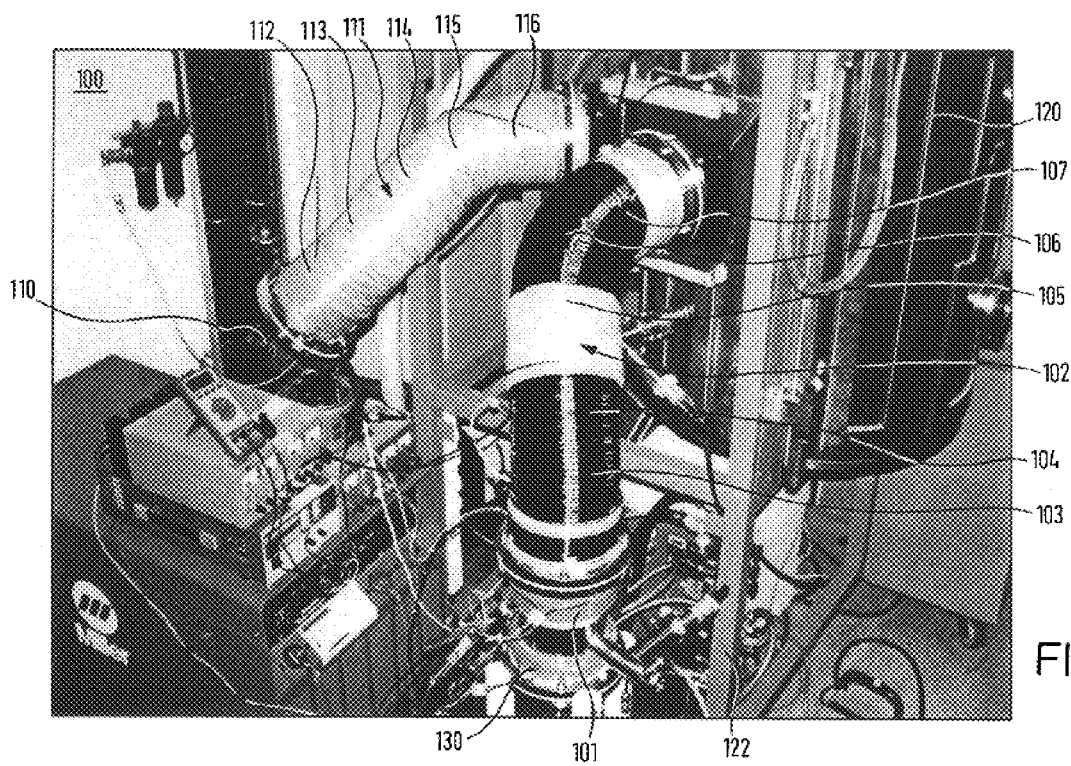

Referring to FIGS. 16 and 17, deposition apparatus (100) is illustrated comprising filtered cathode arc sources having double bend filter ducts. The apparatus has a vacuum chamber (120) and two FCA sources (102, 111). The first source (102) has a cathode and anode (101) for generating an arc from a target (not shown). Positive ions from the target are filtered by a double bend duct comprising a first straight section (103), a first bend (104), a second straight section (105), a second bend (106) and a third straight section (107) that opens into the vacuum coating chamber (120). Both ducts are toroidal in cross-section and have a double bend preventing a line-of-sight from the target to the substrate and preventing also a single bounce path from the target to the substrate. Ports (121) on the chamber allow visual inspection of substrates mounted on a rotatable drum (not shown) inside. Positive ions are steered through the duct by a magnetic field produced from coil windings around the whole length of the duct.

The first bend (104) has an angle of 50 degrees and the second bend (106) has an angle of 60 degrees. These two bends are in different planes, such that the resultant angle between (i) plasma entering the duct and passing through the first straight section (103) and (ii) plasma passing through the third straight section and exiting the duct is 90 degrees.

Likewise, positive ions from the second source are filtered by a double bend duct having first, second and third sections (112, 114, 116) and first and second bends (113, 115). In the case of the second source, the first bend (113) has an angle of 35 degrees, the second bend (115) has an angle of 40 degrees and the resultant angle between the first and third straight sections (112, 116) is 45 degrees.

A frame (122) bears the coating chamber and the two FCA sources.

Example 6

To test the macroparticle filtering ability of the invention, sample coatings were made using the double bend filter duct of the invention and compared with coatings from prior art apparatus and with coatings made using apparatus having just one 90 degree filter duct bend. The results are shown in FIGS. 18–23.

All of FIGS. 18–23 are photographs taken at a magnification of ×125 of deposited layers of TAC that are 600 Angstroms thick.

Figure 18:
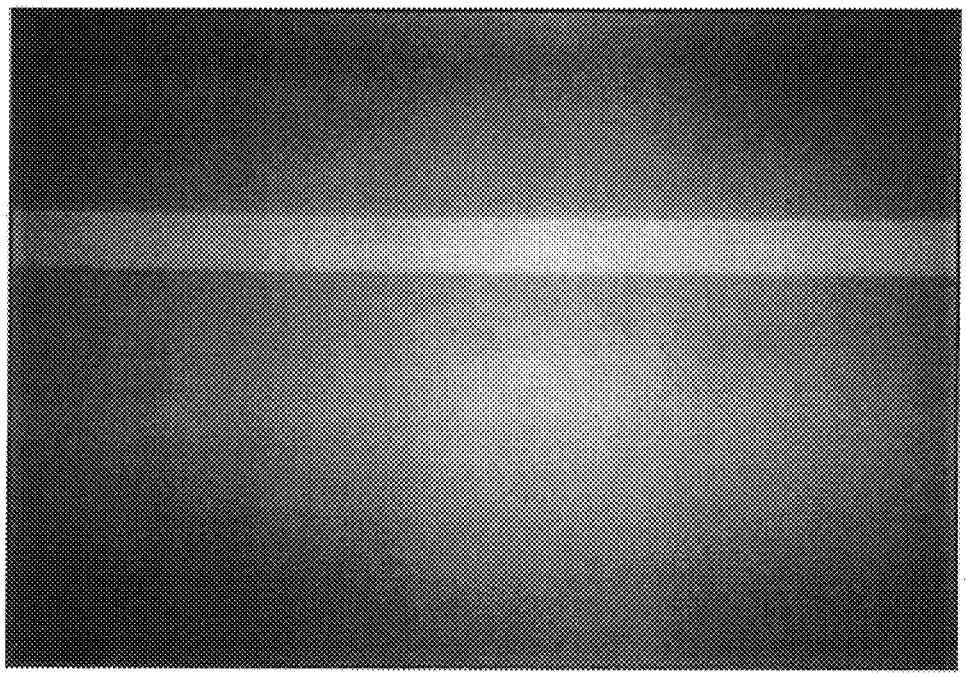
FIGS. 18–23 are photographs comparing coatings produced using apparatus of the invention (FIGS. 18, 19) with coatings of the prior art (FIGS. 20, 21) and coatings made with a single bend filter duct (FIGS. 22, 23).
Figure 19:
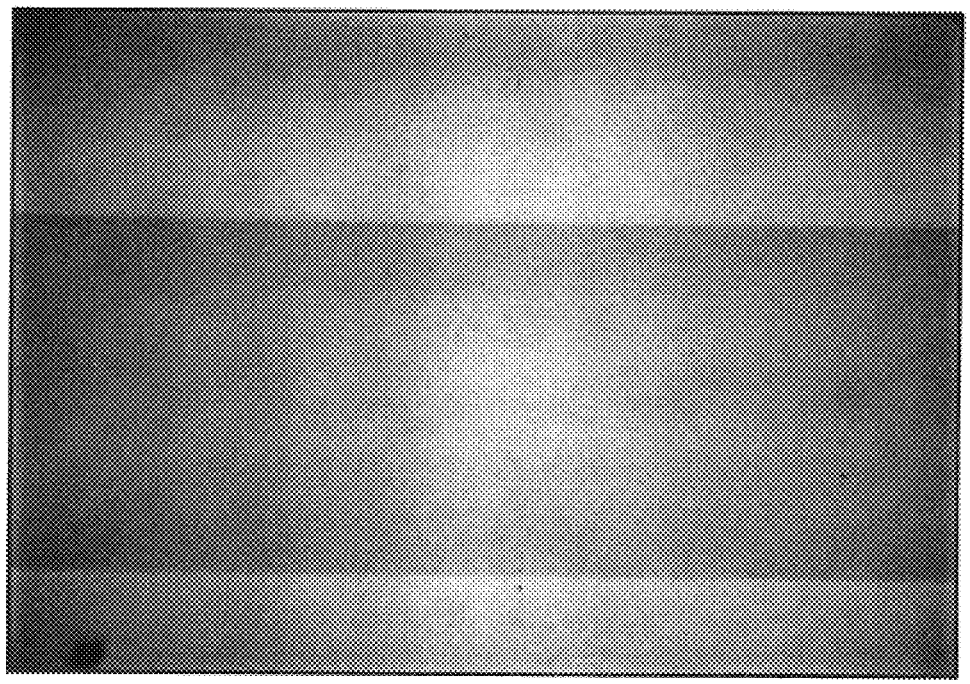

Both FIGS. 18 and 19 are layers deposited using a double bend duct having in and out pieces at 90 degrees, a first bend angle of about 50 degrees and a second bend angle of about 60 degrees. No macroparticles, which would be visible as dark or black blemishes on the photograph, are seen.

Figure 20:
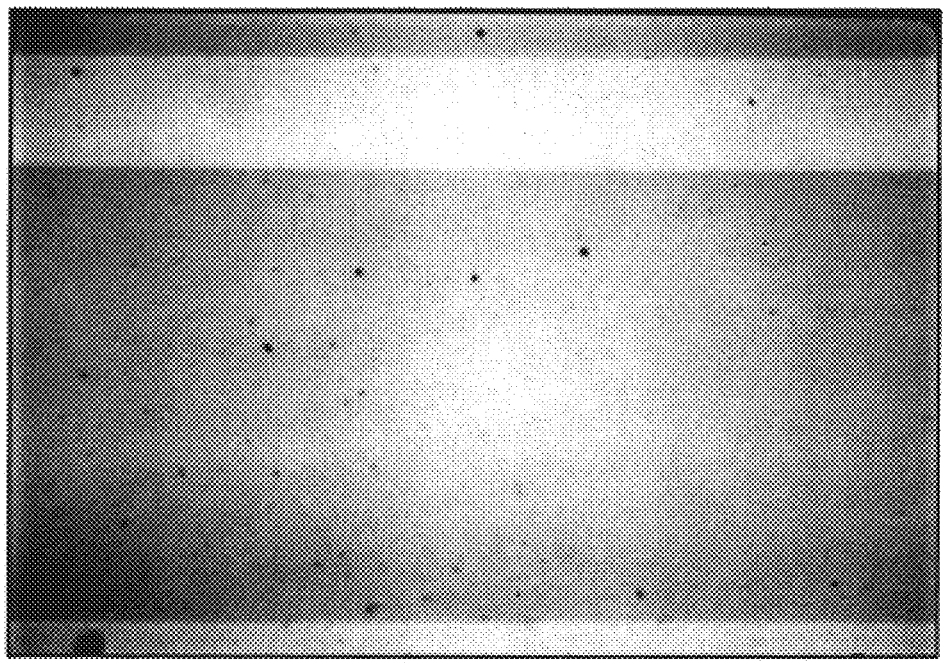
Figure 21:
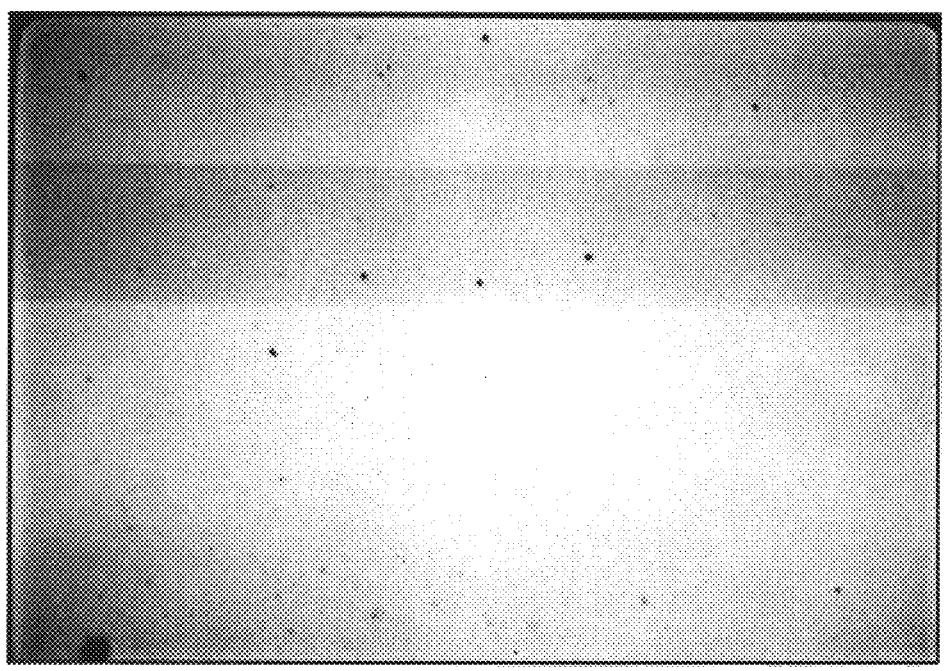

Both FIGS. 20 and 21 are films made using filtered cathode arc equipment commercially available from Commonwealth Scientific Corporation. Numerous contaminating macroparticles, visible as black splodges, are evident.

Figure 22:
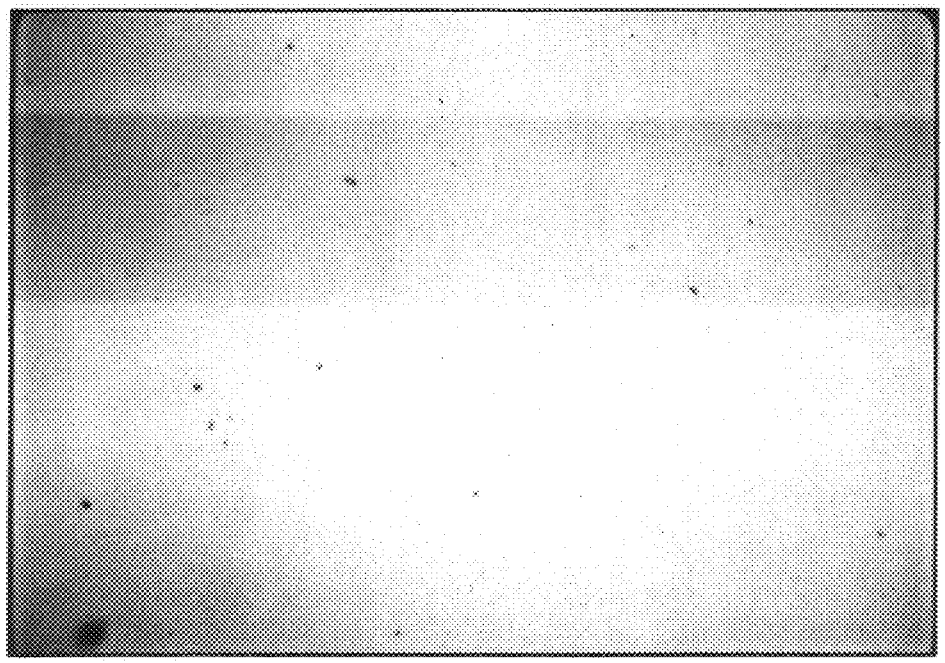
Figure 23:
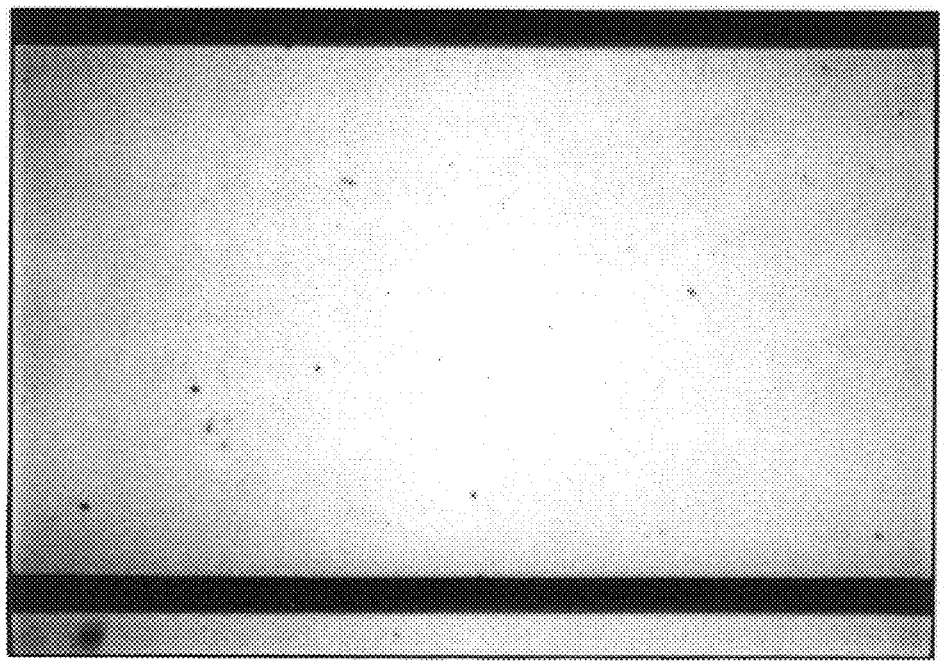

Lastly, both FIGS. 22 and 23 are films made using filtered cathode source apparatus built by the inventors that has a single 90 degree bend in the filter duct. Again, numerous contaminating macroparticles are evident in the film.

Variations and modifications from the described specific embodiments will be apparent from the description to a person of skill in the art and consequently the invention is not to be construed as limited to any specific embodiment.

What is claimed is:

1. Apparatus for applying a coating of positive ions to a substrate, the apparatus comprising:
   a) means for generating an arc at a target cathode;
   b) means for directing a beam of ions emitted from the cathode to the substrate via a filter path substantially to remove macroparticles therefrom;
   c) arc ignition means including an ignition anode located in a retracted position towards a wall of the apparatus, and movable between the retracted position and an ignition position in contact with a surface of the cathode; and
   d) means for storing the position at which arc ignition occurred.

2. The apparatus of claim 1, further comprising a stepper motor for moving the arc ignition means.

3. The apparatus of claim 1, wherein the arc ignition means comprises means for moving the ignition anode towards the ignition position, means for determining arc ignition, and means for returning the arc ignition means to the retracted position after arc ignition.

4. The apparatus of claim 1, wherein the ignition anode is on an end of an igniter arm, the arm having another end which is rotatably mounted on the apparatus.

5. The apparatus of claim 1, wherein the arc ignition means comprises means for moving the ignition anode directly to a first known ignition position.

6. A method of applying a coating of positive ions to a substrate using a cathodic arc source apparatus, comprising the steps of:
   a) generating an arc at a target cathode;
   b) directing a beam of ions emitted from the cathode to the substrate via a filter path substantially to remove macroparticles therefrom;
   c) igniting the arc using an arc ignition means by moving the ignition means from a retracted position retracted towards a wall of the apparatus, towards an ignition position in contact with a surface of the cathode; and
   d) storing the position at which arc ignition occurred.

7. The method according to claim 6, wherein the moving step is performed by moving the arc ignition means using a stepper motor.

8. The method according to claim 6, wherein the moving step is performed by moving the ignition means directly to a first known ignition position.

9. Apparatus for applying a coating of positive ions to a substrate, the apparatus comprising:
   a) a vacuum chamber;
   b) a cathode station in the vacuum chamber;
   c) means for generating an arc at a target cathode located at the cathode station;
   d) means for directing a beam of ions emitted from the cathode to the substrate via a filter path substantially to remove macroparticles therefrom;
   e) arc ignition means including a movable ignition anode located in a retracted position and movable between the retracted position and an ignition position in contact with the cathode; and
   f) means for storing the position at which arc ignition occurred.

* * * * *